(12) United States Patent
Couglar et al.

(10) Patent No.: US 10,236,847 B2
(45) Date of Patent: Mar. 19, 2019

(54) APPARATUS AND METHOD FOR VARIABLE VOLTAGE DISTRIBUTION

(71) Applicant: SKYWORKS SOLUTIONS, INC., Woburn, MA (US)

(72) Inventors: Karl J. Couglar, Oak Ridge, NC (US); Ryan Michael Pratt, Summerfield, NC (US); David Kennedy Homol, Kernersville, NC (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/498,039

(22) Filed: Apr. 26, 2017

(65) Prior Publication Data
US 2017/0279424 A1 Sep. 28, 2017

Related U.S. Application Data

(63) Continuation of application No. 15/135,896, filed on Apr. 22, 2016, now Pat. No. 9,667,210, which is a
(Continued)

(51) Int. Cl.
*H02M 3/158* (2006.01)
*H03F 3/72* (2006.01)
(Continued)

(52) U.S. Cl.
CPC ............ *H03F 3/72* (2013.01); *G05F 1/468* (2013.01); *G05F 1/565* (2013.01); *G05F 1/575* (2013.01); *H01L 27/0928* (2013.01); *H01L 29/0611* (2013.01); *H02M 3/1584* (2013.01); *H03F 1/0261* (2013.01); *H03F 1/34* (2013.01); *H03F 1/56* (2013.01); *H03F 3/19* (2013.01); *H03F 3/195* (2013.01); *H03F 3/211* (2013.01); *H03F 3/217* (2013.01); *H03F 3/245* (2013.01);
(Continued)

(58) Field of Classification Search
None
See application file for complete search history.

(56) References Cited

U.S. PATENT DOCUMENTS 5,010,292 A 4/1991 Lyle, Jr.
5,949,226 A 9/1999 Tanaka et al.
(Continued)

FOREIGN PATENT DOCUMENTS

| KR | 10-1999-0073944 | 10/1999 |
| KR | 10-2009-0007896 | 1/2009 |
| KR | 10-2009-0037462 | 4/2009 |

OTHER PUBLICATIONS

International Search Report in PCT/US2011/039330, dated Jan. 18, 2012, 3 pages.
(Continued)

*Primary Examiner* — Jeffrey A Gblende
(74) *Attorney, Agent, or Firm* — Knobbe Martens Olson & Bear LLP

(57) ABSTRACT

Apparatus and methods for providing variable regulated voltages are disclosed. Variable voltage control elements can adjust a regulated voltage provided by a single voltage regulator, thereby providing a variable regulated voltage. The regulated voltage can be used in a variety of applications, for example, as a bias voltage for a power amplifier.

20 Claims, 12 Drawing Sheets

Related U.S. Application Data continuation of application No. 12/844,597, filed on Jul. 27, 2010, now abandoned.

(60) Provisional application No. 61/352,330, filed on Jun. 7, 2010.

(51) Int. Cl.

| | | |
|---|---|---|
| *G05F 1/565* | (2006.01) | |
| *H03F 1/02* | (2006.01) | |
| *H03H 11/30* | (2006.01) | |
| *H03F 3/217* | (2006.01) | |
| *H03G 3/30* | (2006.01) | |
| *G05F 1/46* | (2006.01) | |
| *G05F 1/575* | (2006.01) | |
| *H03F 1/34* | (2006.01) | |
| *H03F 3/19* | (2006.01) | |
| *H03F 3/21* | (2006.01) | |
| *H01L 27/092* | (2006.01) | |
| *H01L 29/06* | (2006.01) | |
| *H03F 1/56* | (2006.01) | |
| *H03F 3/195* | (2006.01) | |
| *H03F 3/24* | (2006.01) | |
| *H03K 17/687* | (2006.01) | |
| *H04B 1/40* | (2015.01) | |

(52) U.S. Cl.
CPC ............ *H03G 3/30* (2013.01); *H03G 3/3042* (2013.01); *H03H 11/30* (2013.01); *H03K 17/6872* (2013.01); *H04B 1/40* (2013.01); *H03F 2200/18* (2013.01); *H03F 2200/411* (2013.01); *H03F 2200/451* (2013.01); *H03F 2203/21131* (2013.01); *H03F 2203/21139* (2013.01); *H03F 2203/7215* (2013.01); *Y10T 307/406* (2015.04)

(56) References Cited

U.S. PATENT DOCUMENTS

| | | |
|---|---|---|
| 6,246,221 B1 | 6/2001 | Xi |
| 6,462,523 B1 | 10/2002 | Wannenmacher |
| 6,522,110 B1 | 2/2003 | Ivanov |
| 6,630,903 B1 | 10/2003 | Hann et al. |
| 6,724,241 B1 | 4/2004 | Bedarida et al. |
| 6,909,320 B2 | 6/2005 | Chan et al. |
| 7,068,019 B1 | 6/2006 | Chiu |
| 7,170,265 B2 | 1/2007 | Whittaker |
| 7,609,047 B2 | 10/2009 | Ravichandran |
| 7,872,527 B2 | 1/2011 | Smith |
| 8,217,635 B2 | 7/2012 | Nonis et al. |
| 8,368,463 B2 | 2/2013 | Homol et al. |
| 8,441,149 B2 | 5/2013 | Trivedi et al. |
| 9,667,210 B2 | 5/2017 | Couglar et al. |
| 2004/0174148 A1 | 9/2004 | Hiraki et al. |
| 2005/0040800 A1 | 2/2005 | Sutardja |
| 2005/0275387 A1 | 12/2005 | Mitter et al. |
| 2006/0114059 A1 | 6/2006 | Wiegner et al. |
| 2006/0220469 A1 | 10/2006 | Goto et al. |
| 2007/0268008 A1 | 11/2007 | Gicquel et al. |
| 2008/0009248 A1* | 1/2008 | Rozenblit ............ H03F 1/0227 455/127.1 |
| 2008/0142954 A1 | 6/2008 | Hu |
| 2008/0180169 A1* | 7/2008 | Ripley .................. H03F 1/0233 330/133 |
| 2008/0194216 A1 | 8/2008 | Rofougaran |
| 2008/0284394 A1 | 11/2008 | Yin et al. |
| 2009/0040165 A1* | 2/2009 | Shimatani ............ G09G 3/3688 345/98 |
| 2009/0059628 A1 | 3/2009 | Kim |
| 2009/0167275 A1 | 7/2009 | Sutardja |
| 2009/0267579 A1 | 10/2009 | Kim et al. |
| 2010/0156362 A1 | 6/2010 | Xie Yong |
| 2010/0253298 A1* | 10/2010 | Nonis .................. H03K 3/0315 323/282 |
| 2010/0308654 A1 | 12/2010 | Chen |
| 2011/0148388 A1 | 6/2011 | Zanchi et al. |
| 2011/0298280 A1 | 12/2011 | Homol et al. |
| 2011/0298435 A1 | 12/2011 | Homol et al. |

OTHER PUBLICATIONS

Written Opinion of the International Searching Authority in PCT/US2011/039330, dated Jan. 18, 2012, 6 pages.

* cited by examiner

APPARATUS AND METHOD FOR VARIABLE VOLTAGE DISTRIBUTION

PRIORITY CLAIM

This application is a continuation of U.S. patent application Ser. No. 15/135,896, filed Apr. 22, 2016 and titled "APPARATUS AND METHODS FOR GENERATING A VARIABLE REGULATED VOLTAGE," which is a continuation of U.S. patent application Ser. No. 12/844,597, filed Jul. 27, 2010 and titled "APPARATUS AND METHODS FOR GENERATING A VARIABLE REGULATED VOLTAGE," which claims the benefit of priority under 35 U.S.C. § 119(e) of U.S. Provisional Patent Application No. 61/352,330, filed Jun. 7, 2010 and titled "Circuits & Systems," each of which are herein incorporated by reference in their entireties.

BACKGROUND

Field

The disclosed technology relates to electronic systems and, in particular, to voltage regulation in electronic systems.

Description of the Related Technology

Voltage regulators are electronic systems that can be used to maintain constant voltage levels. Typically, electronic voltage regulators compare an output voltage to a fixed, internal reference voltage. Differences between the output voltage and the fixed, internal reference voltage can create a negative feedback loop to reduce the voltage error.

Certain applications can require multiple accurate regulated voltages. For example, certain electronic systems require multiple accurate voltages to bias power amplifiers. In a particular example, RF power amplifiers can be used to boost the power of an RF signal having a relatively low power based on a bias voltage. Thereafter, the boosted RF signal can be used for a variety of purposes, including driving the antenna of a transmitter.

Such voltage regulators can be included in a variety of electronic devices, such as devices with wireless communication functionalities, to provide accurate regulated voltages. For example, in mobile phones having a time division multiple access (TDMA) architecture, such as those found in Global System for Mobile Communications (GSM), code division multiple access (CDMA), and wideband code division multiple access (W-CDMA) systems, a voltage regulator can be used to bias power amplifiers that can be used to shift power envelopes up and down within prescribed limits of power versus time. Advantageously, the amplification of a RF signal can be managed and controlled, as a particular mobile phone can be assigned a transmission time slot for a particular frequency channel. Voltage regulators can be employed to aid in regulating the power level of the RF signal over time, so as to prevent signal interference from transmission during an assigned receive time slot and/or to reduce power consumption.

There is a need for improved voltage regulators. Furthermore, there is a need for reducing die area, current consumption, and overall design complexity in electronic systems. Moreover, there is a need for providing additional flexibility for future architectural changes and/or functionality.

SUMMARY

The system, method, and computer-readable media described in the claims each have several aspects, no single one of which is solely responsible for its desirable attributes. Without limiting the scope of this invention, its more prominent features will now be briefly discussed.

One aspect of the disclosure is an apparatus that includes a voltage regulator and a variable voltage distribution circuit. The voltage regulator can receive a reference voltage, a feedback signal, and a power supply voltage. Based on the received voltages, the voltage regulator can generate a regulated voltage. The variable voltage distribution circuit can receive the regulated voltage from the voltage regulator and generate a plurality of variable regulated voltages and the feedback signal. In some implementations, the variable voltage distribution circuit includes a voltage distribution circuit that can provide a plurality of regulated voltages from one regulated voltage in response to one or more distribution control signals. In some implementations, the variable voltage distribution circuit also includes one or more variable voltage control elements that can selectively control at least one of the plurality of variable regulated output voltages in response to one or more variable voltage control signals.

According to certain implementations, the voltage regulator is a low-dropout regulator. In various implementations, the voltage distribution circuit includes a transmission gate voltage distribution network. In some implementations, at least one of the one or more variable voltage control elements includes an element configured to vary resistance. In certain implementations, one or more of the plurality of variable regulated voltages are electrically connected to one or more power amplifier bias reference input nodes.

In accordance with some implementations, the variable voltage distribution circuit includes one or more complementary metal oxide semiconductor circuit elements. According to a number of implementations, the one or more voltage distribution control signals can represent a plurality of power modes. In certain implementations, the feedback signal is provided by a feedback loop that includes the distribution circuit. According to several implementations, the voltage distribution circuit provides at least one of the plurality of regulated voltages to the one or more variable voltage control elements. In several implementations, the apparatus includes a mobile device.

Another aspect of the disclosure is a method of controlling regulated voltages. The method includes receiving a reference voltage and a power supply voltage; generating a regulated voltage based at least in part on the reference voltage and the power supply voltage; generating a plurality of regulated voltages from the reference voltage using a voltage distribution circuit; and controlling one or more of the regulated voltages using one or more variable voltage control elements to provide one or more variable regulated voltages.

According to certain implementations, the method further includes providing one or more variable regulated voltages to one or more power amplifiers. A first die can include at least one variable voltage control element and a second die can include at least one of the one or more power amplifiers. Additionally, the first die and the second die can be formed using different process technologies.

According to some implementations, generating the regulated voltage is based on a feedback signal provided by the voltage distribution circuit. In certain implementations, two or more of the plurality of regulated voltages are generated concurrently. In accordance with a number of implementations, the method further includes receiving one or more variable voltage control signals and using at least one of the one or more variable voltage control signals to provide different variable regulated voltage levels corresponding to different power modes. In certain implementations, the method further includes receiving one or more voltage distribution control signals and using at least one of the one or more voltage distribution control signals to selectively provide variable regulated voltages to different loads for different power modes. According to some implementations, the method further includes receiving one or more voltage distribution control signals and using at least one of the one or more voltage distribution control signals to selectively provide variable regulated voltages to loads in datapaths configured to generate signals in different frequency bands. In accordance with certain implementations, the one or more variable voltage control elements receive the plurality of regulated voltages from the voltage distribution circuit.

Another aspect of the disclosure is an apparatus that includes means for generating a regulated voltage based on a reference voltage, a feedback signal, and a power supply voltage. The apparatus also includes means for generating a plurality of variable regulated voltages and the feedback signal based on the regulated voltage.

Yet another aspect of the disclosure is a computer-readable storage medium including instructions that when executed perform a method of: receiving a reference voltage and a power supply voltage; generating a regulated voltage based at least in part on the reference voltage, the power supply voltage, and a feedback loop that includes at least a portion of a voltage distribution circuit; generating a plurality of regulated voltages from the reference voltage using the voltage distribution circuit, controlling one or more of the regulated voltages using one or more variable voltage control elements to provide one or more variable regulated voltages.

One more aspect of the disclosure is an apparatus that includes a voltage regulator and a variable voltage circuit. The voltage regulator can receive a reference voltage and a power supply voltage, and generate a regulated voltage based at least in part on the reference voltage and the power supply voltage. The variable voltage circuit can receive the regulated voltage from the voltage regulator and generate at least one variable regulated voltage. The variable voltage distribution circuit can receive the regulated voltage from the voltage regulator and generate at least one variable regulated voltage. The variable voltage distribution circuit includes one or more variable voltage control elements that can selectively control the at least one variable regulated output voltage in response to one or more variable voltage control signals In some implementations, the voltage regulator includes a low-dropout regulator. According to certain implementations, at least one of the one or more variable voltage control elements includes a field effect transistor. In accordance with a number of implementations, the apparatus includes a complementary metal oxide semiconductor integrated circuit that includes at least one of the one or more variable voltage control elements.

According to various implementations, the variable voltage circuit provides a bias voltage to one or more power amplifiers on a separate integrated circuit. The separate integrated circuit can include a circuit element formed with a different process technology than the variable voltage circuit. The separate integrated circuit can include a GaAs die and the variable voltage circuit can include at least one complementary metal oxide semiconductor circuit element.

In accordance with some implementations, one of the at least one variable regulated voltages is electrically connected to one or more current mirrors. In certain implementations, the apparatus includes a mobile device.

Yet another aspect of the disclosure is a method that includes: receiving a reference voltage and a power supply voltage; generating a regulated voltage based at least in part on the reference voltage and the power supply voltage; and controlling the regulated voltage using one or more variable voltage control elements to provide a variable regulated voltages.

In certain implementations, the method further includes providing the variable regulated voltages to one or more power amplifiers. A first die can include at least one variable voltage control element and a second die includes at least one of the one or more power amplifiers. The first die and the second die can be formed using different process technologies.

According to various implementations, the method further includes receiving one or more variable voltage control signals and adjusting the variable regulated voltage based on a power mode of the load receiving the variable regulated voltage in response to at least one of the one or more variable voltage control signals.

Another aspect of the disclosure is an apparatus that includes means for generating a regulated voltage based on a reference voltage and a power supply voltage. The apparatus also includes means for generating a variable regulated voltage from the regulated voltage.

One more aspect of the disclosure is a computer-readable storage medium including instructions that when executed perform a method of: receiving a reference voltage and a power supply voltage; generating a regulated voltage based at least in part on the reference voltage and the power supply voltage; controlling the regulated voltages using one or more variable voltage control elements to provide a variable regulated voltages.

Yet another aspect of the disclosure is an apparatus that includes a voltage regulator that can receive a reference voltage, a feedback signal, and a power supply voltage, and generate based at least in part on the received voltages a regulated voltage. The apparatus also includes a voltage distribution circuit that can receive the regulated voltage from the voltage regulator and generate a plurality of regulated voltages voltage in response to one or more distribution control signals.

In a number of implementations, the voltage regulator includes a low-dropout regulator. According to certain implementations, the voltage distribution circuit includes a transmission gate voltage distribution network. According to some implementations, the voltage distribution circuit includes a transmission gate voltage distribution network. In some implementations, one or more of the plurality of regulated voltages are electrically connected to one or more power amplifier bias reference input nodes. According to various implementations, the voltage distribution circuit includes one or more silicon complementary metal oxide semiconductor circuit elements and at least one of the one or more power amplifiers includes a different process technology. In accordance with certain implementations, the one or more voltage distribution control signals can represent a plurality of power modes. In some implementations, the feedback signal is provided by a feedback loop that includes the distribution circuit. In accordance with a number of implementations, the apparatus includes a mobile device.

One more aspect of the disclosure is a method that includes: receiving a reference voltage and a power supply voltage; generating a regulated voltage based at least in part on the reference voltage and the power supply voltage; and generating a plurality of regulated voltages from the reference voltage using a voltage distribution circuit.

In certain implementations, the method further includes providing one or more regulated voltages to one or more power amplifiers. A first die can include at least a portion of the voltage distribution circuit and a second die can include at least one of the one or more power amplifiers. The first die and the second die can be formed using different process technologies.

According to some implementations, generating the regulated voltage is based on a feedback signal provided by the voltage distribution circuit. In accordance with various implementations, two or more of the plurality of regulated voltages are generated concurrently. In a number of implementations, the method further includes receiving one or more voltage distribution control signals and using at least one of the one or more voltage distribution control signals to selectively provide variable regulated voltages to different loads based on power modes of the loads. According to certain implementations, the method further includes receiving one or more voltage distribution control signals and using at least one of the one or more voltage distribution control signals to selectively provide variable regulated voltages to loads in data paths configured to generate signals in different frequency bands.

Yet another aspect of the disclosure is an apparatus that includes means for generating a regulated voltage based on a reference voltage, a feedback signal, and a power supply voltage. The apparatus also includes means for generating a plurality of regulated voltages and the feedback signal based on the regulated voltage.

And yet another aspect of the disclosure is a computer-readable storage medium including instructions that when executed perform a method of: receiving a reference voltage and a power supply voltage; generating a regulated voltage based at least in part on the reference voltage, the power supply voltage, and a feedback loop that includes at least a portion of a voltage distribution circuit; and generating a plurality of regulated voltages from the reference voltage using the voltage distribution circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/844,638, filed on Jul. 27, 2010, titled "APPARATUS AND METHOD FOR VARIABLE VOLTAGE DISTRIBUTION," published as US 2011/0298280 on Dec. 8, 2011, and to U.S. patent application Ser. No. 12/844,320, filed on Jul. 27, 2010, titled "APPARATUS AND METHOD FOR VOLTAGE DISTRIBUTION," published as 2011/0298435 on Jul. 27, 2010, each of which are herein incorporated by reference in their entireties.

DETAILED DESCRIPTION OF CERTAIN EMBODIMENTS

Figure 1:
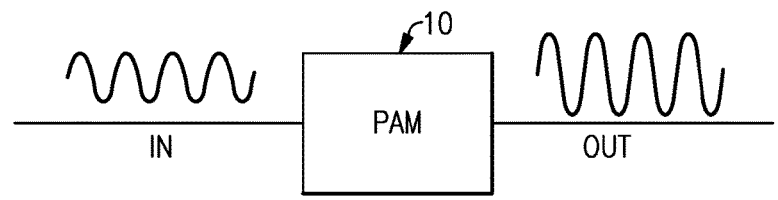
FIG. 1 schematically depicts a power amplifier module for amplifying a radio frequency (RF) signal.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

The headings provided herein, if any, are for convenience only and do not necessarily affect the scope or meaning of the claimed invention.

Provided herein are various non-limiting examples of devices and methods for facilitating amplification of a radio frequency (RF) signal. FIG. 1 schematically depicts a power amplifier module (PAM) 10 that can be configured to achieve such an amplification of the RF signal so as to yield an output RF signal. As described herein, the power amplifier module can include one or more power amplifiers (PA).

Figure 2:
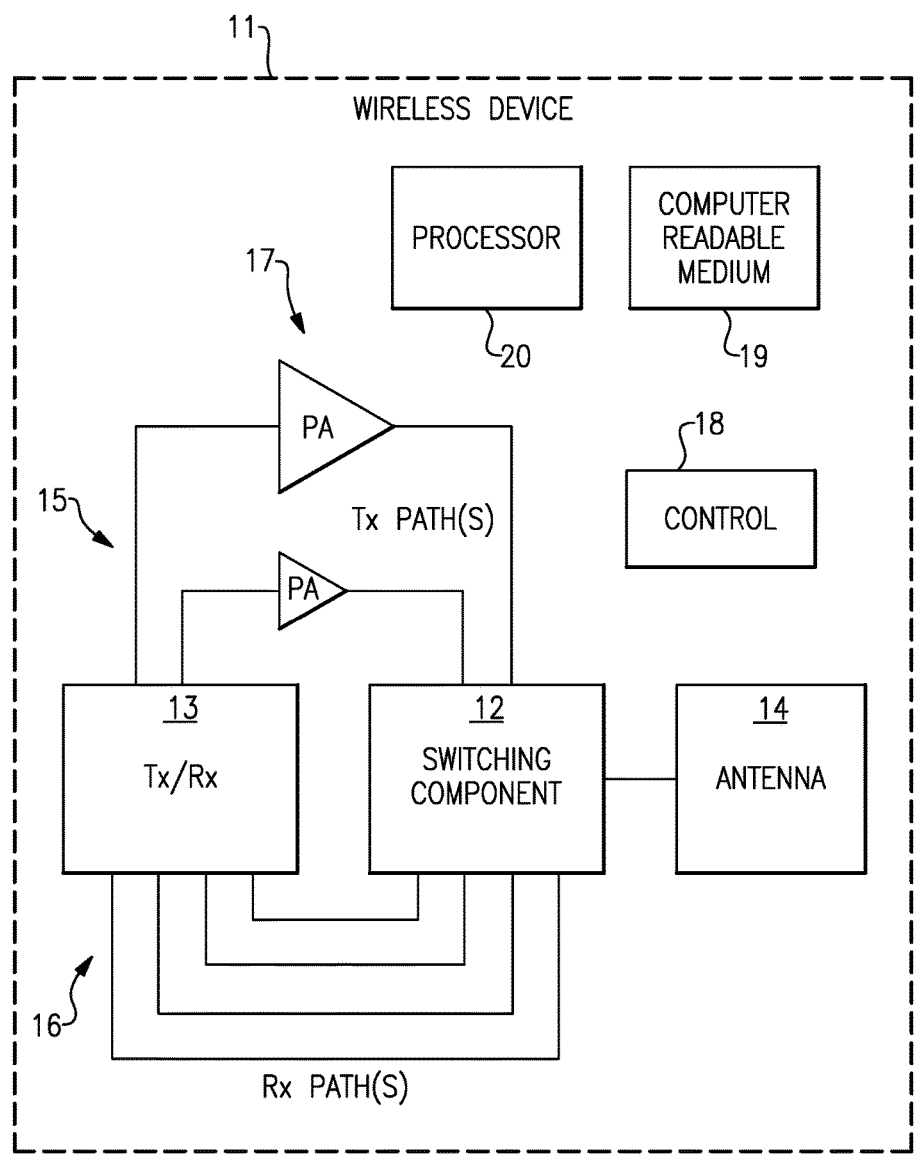
FIG. 2 schematically depicts an example wireless device that can have one or more of the power amplifier modules of FIG. 1 configured to provide one or more functionalities as described herein.

FIG. 2 schematically depicts a device 11, such as a wireless device, for which one or more power amplifiers controlled by one or more features of the present disclosure can be implemented. The example wireless device 11 depicted in FIG. 2 can represent a multi-band and/or multi-mode device such as a multi-band/multi-mode mobile phone.

By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 900 MHz and 1900 MHz bands.

One or more features of the present disclosure can be implemented in the foregoing example modes and/or bands, and in other communication standards. For example, 3G and 4G are non-limiting examples of such standards.

In certain embodiments, the wireless device 11 can include a transceiver component 13 configured to generate RF signals for transmission via an antenna 14, and receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with one or more antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with.

FIG. 2 shows that in certain embodiments, a switching component 12 can be provided, and such a component can be configured to provide a number of switching functionalities associated with an operation of the wireless device 11. In certain embodiments, the switching component 12 can include a number of switches configured to provide functionalities associated with, for example, switching between different bands, switching between different power modes, switching between transmission and receiving modes, or some combination thereof. Various non-limiting examples of such switches are described herein in greater detail.

FIG. 2 shows that in certain embodiments, a control component 18 can be provided, and such a component can be configured to provide various control functionalities associated with operations of the switching component 12, the power amplifiers 17, and/or other operating component(s). Non-limiting examples of the control component 18 are described herein in greater detail.

FIG. 2 shows that in certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory (19 in FIG. 2) that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

Figure 3A:
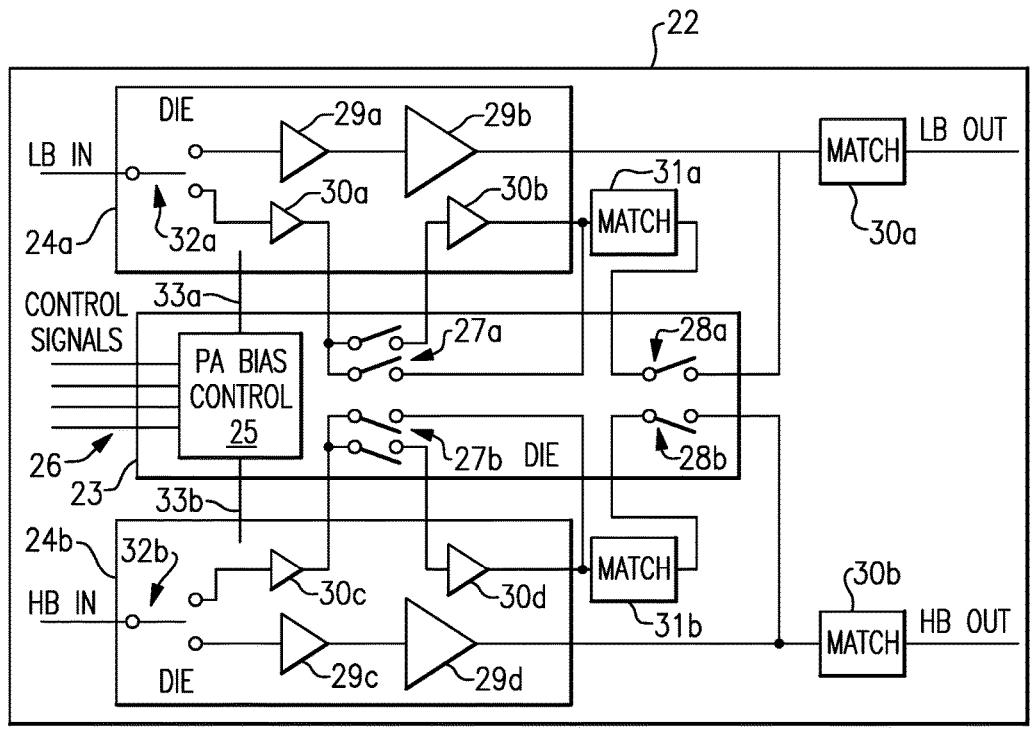
FIGS. 3A and 3B show example system architectures that can be implemented in the wireless device of FIG. 2.
Figure 3B:
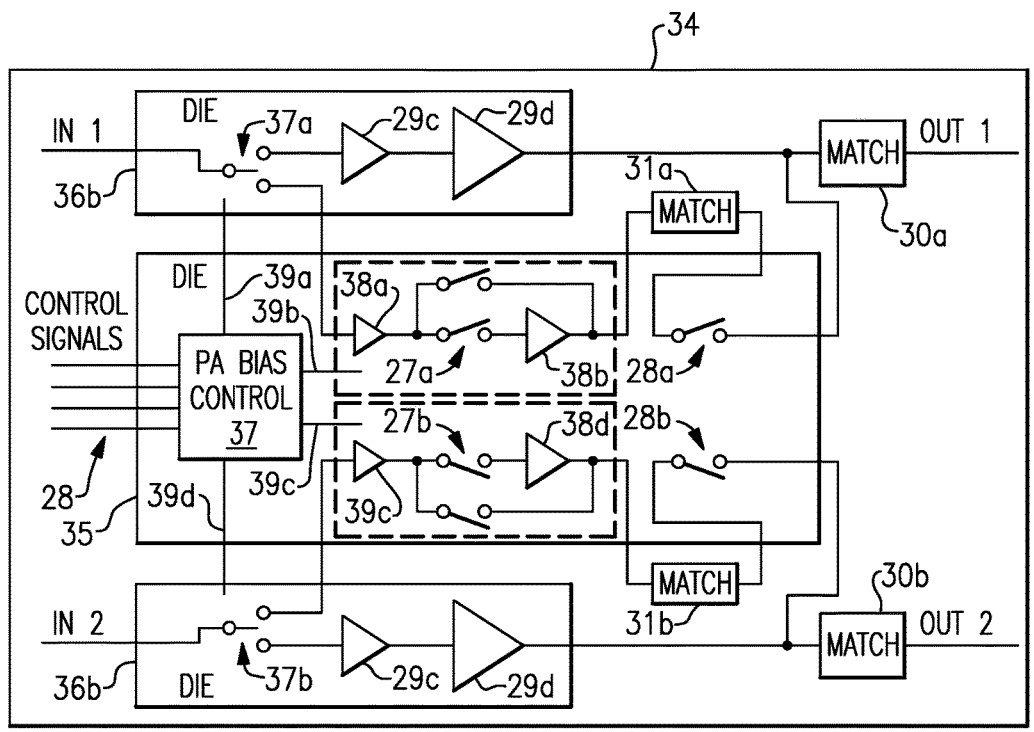

FIGS. 3A and 3B show non-limiting examples of system architectures that can include one or more features of the present disclosure. For the purpose of description, the example architectures are depicted with two RF bands; however, it will be understood that other numbers of RF bands are also possible. For example, system architectures having similar functionalities can be implemented in configurations having more than two bands (e.g., quad-band) or a single-band configuration.

In one example architecture 22, a first RF input indicated as "LB IN" and corresponding to a first band (e.g., a low band) can be amplified by one or more power amplifiers disposed and/or formed on a die 24a. Such amplified output RF signal is indicated as "LB OUT," and can be subjected to impedance matching (e.g., to approximately 50Ω) by a component depicted as 30a. Similarly, a second RF input indicated as "HB IN" and corresponding to a second band (e.g., a high band) can be amplified by one or more power amplifiers disposed and/or formed on a die 24b. Such amplified output RF signal is indicated as "HB OUT," and can be subjected to impedance matching by a component depicted as 30b (e.g., to approximately 50Ω).

In certain embodiments, amplification for a given RF band can include two or more amplification modes. For the example low RF band, the RF input LB IN can be routed to a high power amplification mode or a low/medium power amplification mode via a switch depicted as 32a. If the switch 32a is set for the high power mode, the RF signal can undergo amplification by one or more power amplifiers (e.g., by staged amplifiers 29a and 29b) so as to yield a high power output. If the switch 32a is set for the low/medium power mode, the RF signal can undergo amplification by one or more power amplifiers.

In certain embodiments, the switch 32a need not be employed. For example, the input impedance of the staged amplifiers 29a and 30a can be substantially matched, and the RF input LB IN can be provided to both staged amplifiers 29a and 30a.

In the example shown, a low power mode can be achieved by utilizing a power amplifier 30a; and a medium power mode can be achieved by amplifying the RF signal in stages by the power amplifier 30a and a second power amplifier 30b. Examples of switching and routing of the RF signals to allow selection of the low, medium and high power operating modes are described herein in greater detail. The low/medium amplified output RF signal can be subjected to impedance matching by a component depicted as 31a prior to being output in a manner similar to that of the high power output signal.

Similarly, for the example high RF band, the RF input HB IN can be routed to a high power amplification mode or a low/medium power amplification mode via a switch depicted as 32b. If the switch 32b is set for the high power mode, the RF signal can undergo amplification by one or more power amplifiers (e.g., by staged amplifiers 29c and 29d) so as to yield a high power output.

If the switch 32b is set for the low/medium power mode, the RF signal can undergo amplification by one or more power amplifiers. In the example shown, a low power mode can be achieved by utilizing a power amplifier 30c; and a medium power mode can be achieved by amplifying the RF signal in stages by the power amplifier 30c and a second power amplifier 30d. Examples of switching and routing of the RF signals to allow selection of the low, medium and high power operating modes are described herein in greater detail. The low/medium amplified output RF signal can be subjected to impedance matching by a component depicted as 31b prior to being output in a manner similar to that of the high power output signal.

In the example architecture 22 depicted in FIG. 3A, operation of the low and medium power modes can be facilitated by switch assemblies 27a, 28a (for the low band) and 27b, 28b (for the high band). To operate in a low or medium power mode, for the low band, the switch 28a can be closed, and the switch 32a can be in a state that routes the LB IN signal to the power amplifier 30a. To operate in a medium power mode, a connecting switch (depicted as the upper one in the switch assembly 27a) can be closed and a bypass switch (depicted as the lower one) can be opened, such that the power amplifiers 30a and 30b amplify the LB IN signal in stages to yield the medium power output. To operate in a low output mode, the connecting switch of the switch assembly 27a can be opened and the bypass switch of the switch assembly 27a can be closed, such that the LB IN signal is amplified by the power amplifier 30a by bypasses the power amplifier 30b so as to yield the low power output. Operation of low or medium power mode for the high band can be achieved in a similar manner utilizing the switch assemblies 27b and 28b.

In the example configuration 22 shown in FIG. 3A, various switches (e.g., 27a, 27b, 28a, 28b) are depicted as being part of a die 23. In certain embodiments, the die 23 can also include a power amplifier bias control component 25.

The PA bias control component 25 is depicted as controlling the example PAs (29a, 29b, 30a, 30b of the low band portion, and 29c, 29d, 30c, 30d of the high band portion) via bias control lines depicted as 33a and 33b. In certain embodiments, the PA bias control component 25 can be provided with one or more input control signals 26 so as to facilitate one or more functionalities associated with various PAs as described herein.

In certain embodiments, various switches and power amplifiers associated with the dies depicted as 24a, 24b can be fabricated on substrates such as gallium arsenide (GaAs) utilizing devices such as pseudomorphic high electron mobility transistors (pHEMT) or bipolar field effect transistors (BiFET). In certain embodiments, the dies depicted as 24a, 24b in FIG. 3A can be formed on the same GaAs substrate, or on separate GaAs substrates. Further, functionalities associated with the dies depicted as 24a, 24b can be formed on a single die, or on separate dies.

In certain embodiments, various switches (e.g., 27a, 27b, 28a, 28b) associated with operation of various PAs (e.g., 29a, 29b, 30a, 30b of the low band portion, and 29c, 29d, 30c, 30d of the high band portion) can be fabricated as complementary metal-oxide-semiconductor (CMOS) devices. In certain embodiments, at least some of the PA bias control component 25 can be implemented on a CMOS die. In the example shown in FIG. 3A, the switches (e.g., 27a, 27b, 28a, 28b) and the PA bias control component 25 are depicted as being parts of the same CMOS die 26. In certain embodiments, such switches and PA bias control component can be parts of different CMOS dies.

In certain embodiments, at least one power amplifier and one or more switches associated with its operation can be implemented on a CMOS die. FIG. 3B shows an example architecture 34 that can generally provide dual-band signal amplification functionalities similar to that described in reference to FIG. 3A. In FIG. 3B, "IN 1" and "OUT 1" can represent the low band input and output LB IN and LB out; and "IN 2" and "OUT 2" can represent the high band input and output HB IN and HB OUT. Further, switching functionality associated with switches 32a and 32b can be provided by switches 37a and 37b. For high power mode of operation, PAs 29a, 29b, 29c, 29d that are parts of dies 36a, 36b can be similar to the dies 24a, 24b described in reference to FIG. 3A.

In FIG. 3B, power amplifiers 38a, 38b, 38c, 38d corresponding to the medium/low power modes are depicted as being formed on the same die 35 (e.g., CMOS die) on which the switches (e.g., 27a, 27b, 28a, 28b) are formed. Other than these components being on the same CMOS die, operation of the example medium/low power modes can be achieved in a manner similar to those described in reference to FIG. 3A.

Similar to FIG. 3A, the example configuration 34 of FIG. 3B includes a PA bias control component 37 that is part of the example CMOS die 35. The PA bias control component 37 is depicted as receiving one or more input control signals 28 and controlling one or more functionalities associated with the various PAs. The PAs (e.g., 29a, 29b for the first band, and 29c, 29d for the second band) associated with the high power mode are depicted as being controlled via bias control lines 39a and 39b. The PAs (e.g., 38a, 38b for the first band, and 38c, 38d for the second band) associated with the medium/low mode are depicted as being controlled via bias control lines 39c and 39d.

It will be understood that the configurations 22 and 34 of FIGS. 3A and 3B are specific examples of design architectures that can be implemented. There are a number of other configurations that can be implemented utilizing one or more features of the present disclosure.

Figure 4A:
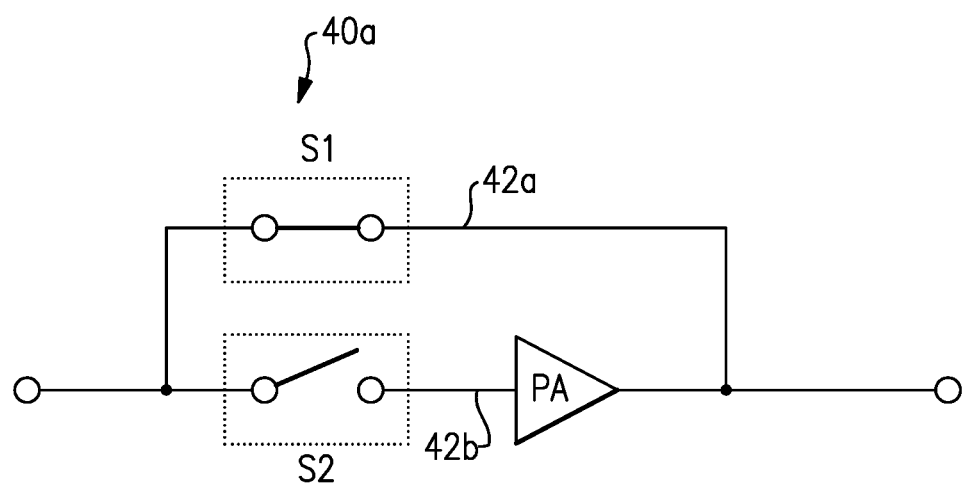
FIGS. 4A and 4B schematically depict an example of how an RF signal to a power amplifier can be switched ON or OFF.
Figure 4B:
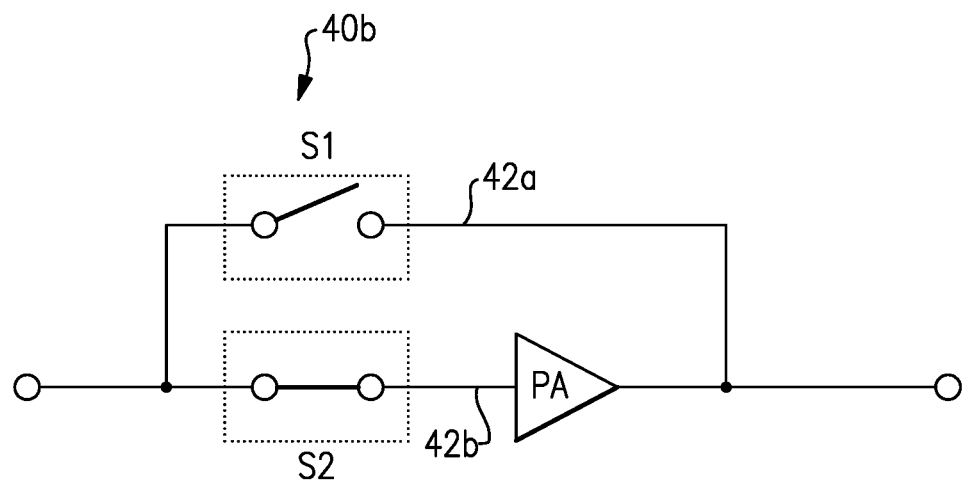

In the context of switches for RF power amplifiers, FIGS. 4A and 4B shows a switching configuration 40 that can form a basis for more complex architectures. In a signal path configuration 40a of FIG. 4A, an RF signal can be routed through a first path 42a by providing a switch S1 that is closed. In the configuration 40a, second path 42b is depicted as having a switch S2 that is open and a power amplifier. Thus, for the purpose of operating the power amplifier in the example path 42b, the configuration 40a can represent an OFF state.

In a signal path configuration 40b of FIG. 4B that can represent an ON state for the power amplifier, the switch S2 on the second path 42b is closed and the switch S1 on the first path 42a is open. For the purpose of description of FIGS. 4A and 4B, the first example path 42a is depicted without any component other than the switch S1. It will be understood that there may be one or more components (e.g., one or more power amplifiers) along the first path 42a.

In the context of power amplifiers that can be included in portable and/or wireless devices (e.g., mobile phones), a power amplifier system can be subjected to varying processes and operating conditions such as voltage and temperature variations. For example, a power amplifier system can be powered using a variable supply voltage, such as a battery of a mobile phone.

In certain situations, it can be important for a power amplifier system to switch between power modes so that the power amplifier switch can control power consumption. For example, in a mobile device embodiment, having a plurality of power modes allows the power amplifier to extend battery life. Control signals, such as mode input signals received on a pin or pad, can be used to indicate a desired mode of operation. The power amplifier system can include a plurality of RF signal pathways, which can pass through power amplification stages of varying gain. Switches can be inserted in and/or about these pathways, and switch control logic can be used to enable the switches and power amplifiers associated with the selected power amplifier RF signal pathway.

Placing a switch in a signal path of a power amplifier (e.g., in the example signal path 42b of FIGS. 4A and 4B) can produce a number of effects. For example, insertion of a switch into a RF signal pathway can result in a loss of signal power due to radiation and resistive losses. Additionally, even a switch in an OFF state placed along an active RF signal pathway can attenuate a RF signal. Thus, it can be important that the switch introduce low insertion loss in both ON and OFF states. Furthermore, it can be important that the switch be highly or acceptably linear, so as to reduce distortion of a RF signal which passes through the switch. Distortion can reduce the fidelity of an RF signal; and reduction of such distortion can be important in a mobile system embodiment.

In certain embodiments, switches can be integrated on a mixed-transistor integrated circuit (IC) having power amplification circuitry, such as a BiFET, BiCMOS die employing silicon or GaAs technologies. Additionally, switches can be provided on a discrete die, such as a pHEMT RF switch die, and can be configured to interface with a mixed-transistor power amplifier die to implement a configurable power amplifier system. However, these approaches can be relatively expensive and consume significant amounts of area as compared to a silicon CMOS technology. Power consumption and the area of a power amplifier system can be important considerations, such as in mobile system applications. Thus, there is a need for employing a CMOS switch in a RF signal power amplifier system.

In certain embodiments, CMOS RF switches can be relatively large, so that the switch resistance in an ON-state can be relatively small so as to minimize RF insertion loss. However, large CMOS RF switches can have undesirable parasitic components, which can cause significant leakages and cause damage to RF signal fidelity. Additionally, the wells and active areas of the CMOS RF switches can have associated parasitic diode and bipolar structures. Without proper control of the wells of a CMOS RF switch, parasitic structures may become active and increase the power consumption of the power amplifier system and potentially render the system dysfunctional. Furthermore, CMOS devices are susceptible to breakdown, such as gate oxide breakdown, and other reliability concerns, so it can be important to properly bias a CMOS RF switch during operation.

In certain embodiments, one or more switches described herein can be selectively activated depending on a variety of factors, including, for example, a power mode of the power amplifier system. For example, in a high power mode a CMOS RF switch may be positioned in an OFF state and configured to be in a shunt configuration with the active RF signal path. The isolated P-well voltage of such a switch can be controlled to both prevent overvoltage or other stress conditions which may endanger the reliability, while optimizing or improving the linearity of the switch. The linearity of the RF signal pathway having a shunt CMOS switch in an OFF-state can be improved by keeping the isolated P-well voltage at a selected voltage (e.g., relatively low voltage) so as to avoid forward biasing of parasitic diode structures formed between the P-well and the N-type diffusion regions of the source and drain. By preventing the forward-biasing of parasitic diode structures, the injection of unintended current into the active RF signal pathway can be avoided, thereby increasing linearity of the power amplifier system.

Figure 5:
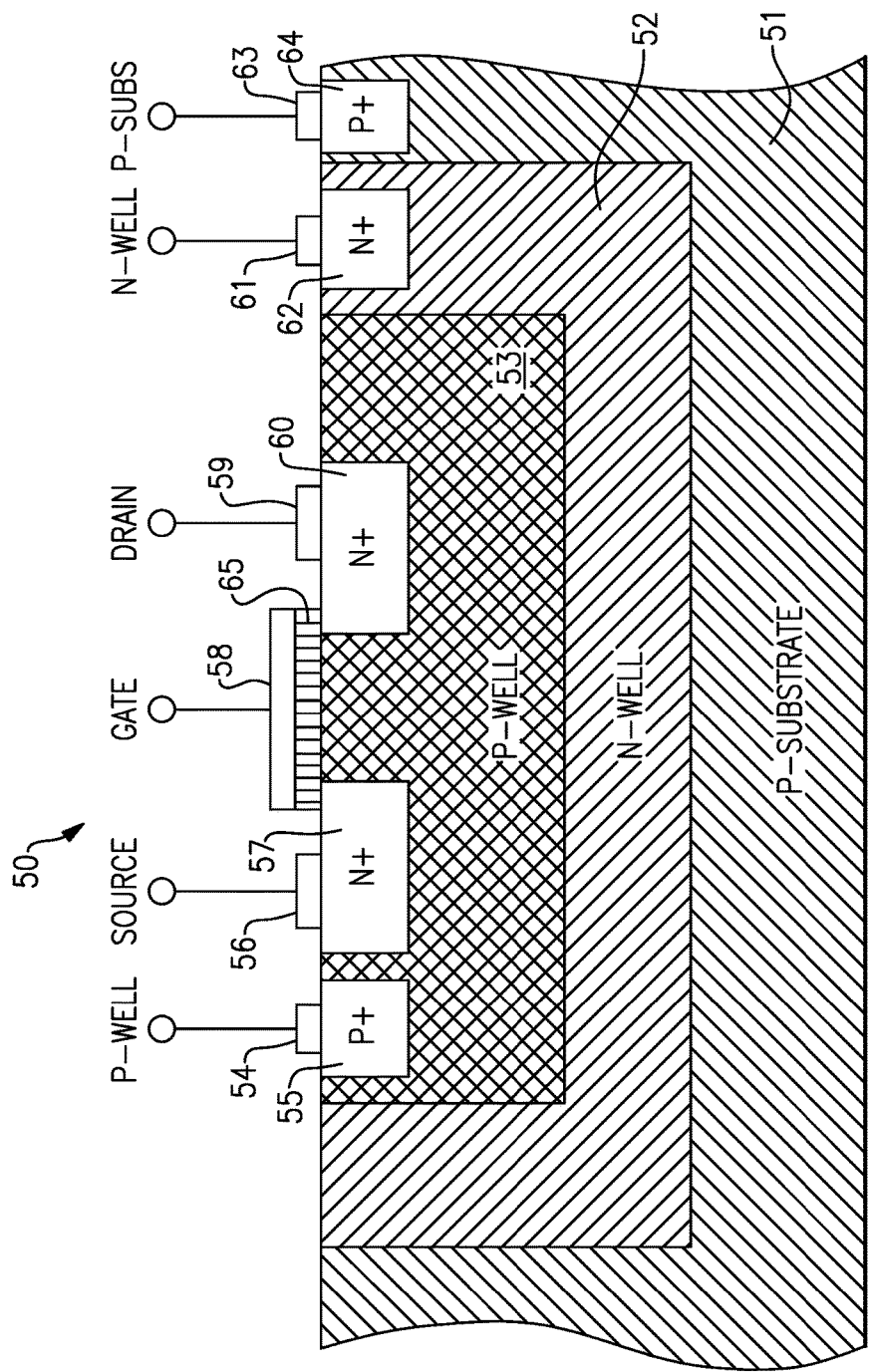
FIG. 5 shows that in certain embodiments, the switch depicted in FIGS. 4A and 4B can be formed as a triple-well CMOS device.

In certain embodiments, some or all of the foregoing example properties can be addressed by one or more features associated with a CMOS RF switch, such as a switch 50 depicted in FIG. 5. The example switch 50 can include a triple-well structure having an N-well 52 and a P-well 53 formed on a P-type substrate 51. As shown in FIG. 5, the N-well 52 can surround the P-well 53 so as to electrically isolate the P-well 53 from the substrate 51. The N-well 52 can be formed by using, for example, a deep N-well or any other suitable N-type buried layer.

The switch 50 further includes a source terminal 56 and a drain terminal 59. An oxide layer 65 is disposed on the P-well 53, and a gate 58 is disposed on top of the oxide layer 65. An N-type source diffusion region and an N-type drain diffusion region corresponding to the source and drain terminals (56, 59) are depicted as regions 57 and 60, respectively. In certain embodiments, formation of the triple-well structure and the source, drain and gate terminals thereon can be achieved in a number of known ways.

In certain operating situations, an input signal can be provided to the source terminal 56. Whether the switch 50 allows the input signal to pass to the drain terminal 59 (so as to yield an output signal) can be controlled by application of bias voltages to the gate 58. For example, application of a first gate voltage can result in the switch 50 being in an "ON" state to allow passage of the input signal from the source terminal 56 to the drain terminal 59; while application of a second gate voltage can turn the switch 50 "OFF" to substantially prevent passage of the input signal.

In certain embodiments, the switch 50 can include a P-well terminal 54 connected to the P-well 53 by a P-type diffusion region 55. In certain embodiments, the P-type diffusion region 55 and the N-type diffusion regions 57 and 60 can be all formed substantially in the P-well 53. In certain embodiments, the P-well terminal 54 can be provided with one or more voltages, or held at one or more electrical potentials, to facilitate controlling of an isolated voltage of the P-well. Examples of such P-well voltages are described herein in greater detail.

In certain embodiments, the switch 50 can include an N-well terminal 61 connected to the N-well 52 by an N-type diffusion region 62. In certain embodiments, the N-type diffusion region 62 can be formed substantially in the N-well 52. In certain embodiments, the N-well terminal 61 can be provided with one or more voltages, or held at one or more electrical potentials, to provide the switch 50 with one or more desired operating performance features. One or more examples of such N-well voltages are described herein in greater detail.

In certain embodiments, the switch 50 can include a P-type substrate terminal 63 connected to the P-type substrate 51 and having a P-type diffusion region 64. In certain embodiments, the P-type diffusion region 64 can be formed substantially in the P-type substrate 51. In certain embodiments, the P-type substrate terminal 63 can be provided with one or more voltages, or held at one or more electrical potentials, to provide the switch 50 with one or more desired operating performance features. One or more examples of such N-well voltages are described herein in greater detail.

Figure 6:
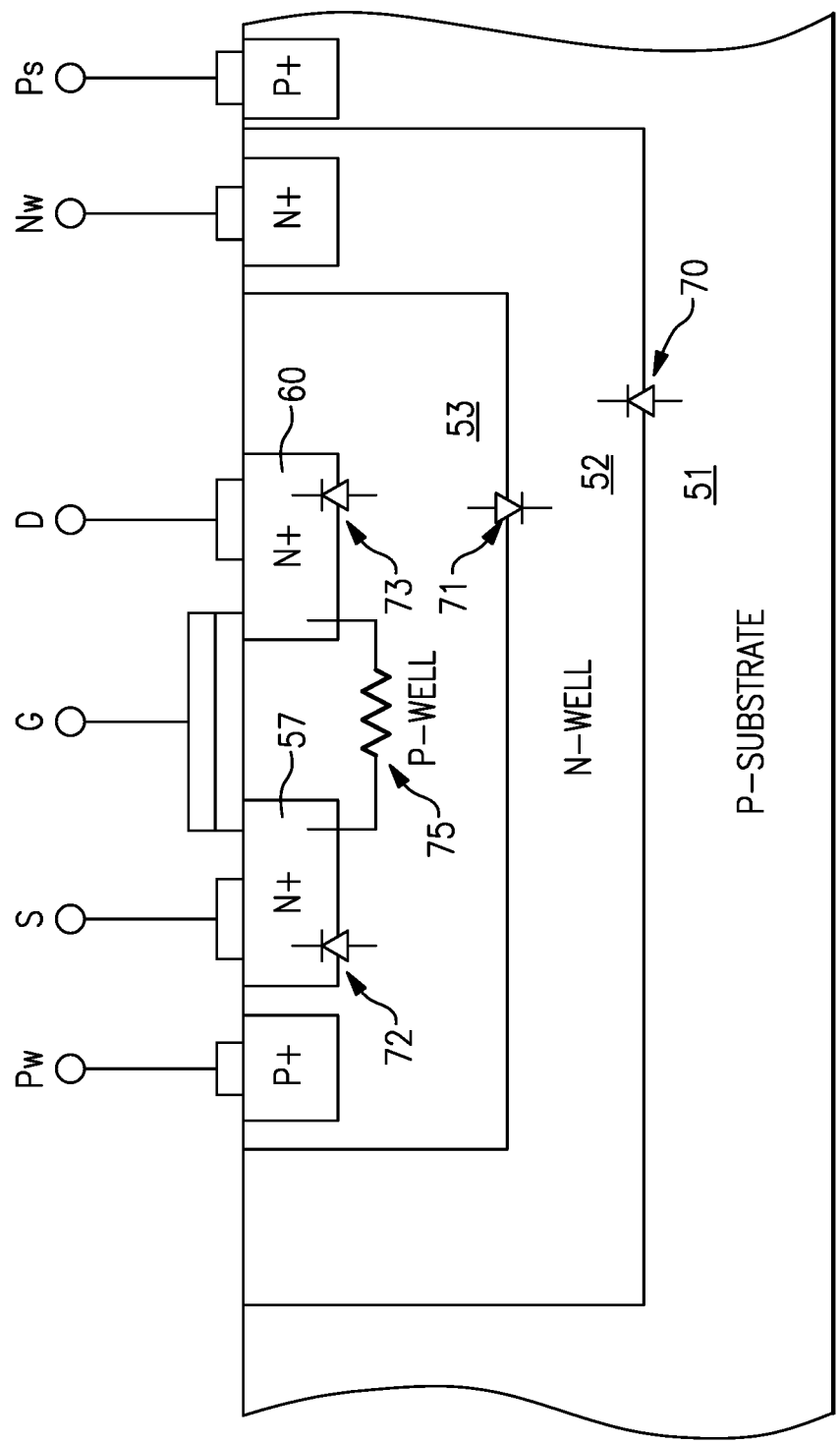
FIG. 6 shows an example configuration for operating the triple-well CMOS switch of FIG. 5.

In the example CMOS device shown in FIG. 5, the switching functionality of the switch 50 is generally provided by an NMOS transistor defined by the N-type diffusion regions (57, 60) in the P-well 53. FIG. 6 shows that for such a configuration, diodes can form at p-n junctions of the triple well structure. For example, a diode 72 can have an anode formed from the P-well 53, and a cathode formed from the N-type diffusion region 57. Similarly, a diode 73 can have an anode formed from the P-well 53 and a cathode formed from the N-type diffusion region 60. Depending on the voltage of the P-well 53 relative to the voltages of the N-type diffusion regions 57 and 60, the diodes 72 and 73 can be biased in, for example, a reverse bias or forward bias region of operation. For the purpose of description herein, bias voltages applied to the N-type diffusion regions 57 and 60 (corresponding to the source and drain terminals, respectively) may or may not be the same. Further, for the purpose of description herein, a reverse bias can include a configuration where a voltage associated with an N-type region is equal to or greater than a voltage associated with a P-type region that forms a p-n junction with the N-type region.

In certain embodiments, the N-type diffusion regions 57 and 60 can be held at substantially the same DC voltage. In certain embodiment, such a configuration can be achieved by providing a relatively large value shunt resistor (e.g., polysilicon resistor) 75 across the source and the drain.

In the context of triple-well CMOS devices, the N-well 52 can substantially isolate the P-well 53 from the P-type substrate 51. In certain embodiments, the presence of the N-well 52 between the P-well 53 and the P-type substrate 51 can result in two additional diodes. As shown in FIG. 6, the illustrated triple well structure can include a diode 71 having an anode formed from the P-well 53 and a cathode formed from the N-well 52. Similarly, the triple well structure can include a diode 70 having an anode formed from the P-type substrate 51 and a cathode formed from the N-well 52.

In certain embodiments, the switch 50 can be operated so as to reverse-bias one or more of the diodes shown in FIG. 6. To maintain such reverse-biases, the source terminal, drain terminal, gate terminal, P-well terminal, N-well terminal, P-substrate terminal, or any combination thereof, can be provided with one or more voltages, or held at one or more electrical potentials. In certain embodiments, such voltages or electrical potentials can also provide one or more additional functionalities that can improve the performance of the switch 50. Non-limiting examples of such performance enhancing features are described herein in greater detail. Although FIGS. 5 and 6 have described an NMOS transistor as providing the functionality of a switch, a PMOS transistor can also be employed.

Voltage Regulation

A number of applications can require multiple accurate regulated voltages. For example, multiple accurate power amplifier (PA) bias voltages can be required in the systems of FIGS. 3A, 3B, among others. As discussed above, PAs can be implemented in a number of applications, for example, mobile devices such as mobile phones. The techniques described herein that use a single voltage regulator to provide variable and/or distributed regulated voltages can result in power savings that can have result in numerous advantages, for example, prolonging battery life of a mobile device. Prolonged battery life can be convenient in some circumstances and critical in others. For example, a longer battery life can be a matter of life or death in emergency situations, such as being lost in the woods or trapped in a car during a snowstorm. Additionally, a longer battery life is good for the environment, as less power consumption helps to prevent depletion of natural resources and reduces the need for additional power generation.

One conventional approach to providing multiple accurate regulated voltages involves using multiple low-dropout regulators (LDOs) to regulate the voltages that are passed to each stage of a PA at each power mode. An LDO for each stage is typically implemented, as well as LDOs with different output voltages. Although it can be desirable to keep current and area consumption as low as possible, these conventional approaches to voltage regulation can increase die area and voltage distribution complexity. Moreover, multiple LDOs can also make such designs and their respective products fail cost, area, and/or current consumption targets or specifications. Another conventional approach to achieve variable PA quiescent bias points is to add a bleed function to the PA bias.

Advantageously, accurate voltages as programmed and/or controlled by a user can be distributed using a single voltage regulator, such as a single LDO. Alternatively or additionally, each of these accurate voltages can be selectively adjusted to a desired voltage level using one or more variable voltage control elements. Moreover, distribution and/or variable control of regulated voltage(s) can be done in a manner consistent with the demanding specifications required for analog circuits. Using a single voltage regulator instead of multiple voltage regulators can result in significant savings in die area, lower current consumption, and reduced design complexity. In addition, such a solution can provide additional flexibility for future architectural changes or functionality.

Further, multiple voltage references can be used to create different quiescent bias points depending upon a desired power mode. The specifications in the industry for quiescent current in each power mode for the PAM can be aggressive, especially for PAs used in RF applications. Therefore, there is a need to change the regulated voltage to some of the PA transistors depending on a chosen power mode.

Moreover, a number of process technologies can be used to implement such a voltage regulator, including without limitation GaAs, pHEMPT, BiFET, and CMOS technologies. Although GaAs, pHEMPT, or BiFET technologies have typically been considered more desirable technologies than CMOS for implementing PAM RF switches and their associated data paths, voltage regulation can be implemented in CMOS according to one embodiment. Multimode products being introduced on the market today can require advanced architectures used to switch between various power modes (e.g., high power, medium power, and low power). One such architecture is available in products from the Assignee of this application, Skyworks Solutions, Inc. of Woburn, Mass. With market pressure to reduce costs and maintain profitable gross margins, these architectures may become more cost-effective by using a lower cost technology, such as bulk or triple-well CMOS, despite certain shortcomings. For example, using CMOS RF switches in such a hybrid application, the RF CMOS switches used are typically very large to provide low RF insertion loss. Due to their size and undesirable parasitics, these switches can exhibit significant losses and leakages. These leakages can lead to problematic and/or unintended forward active regions of operation which make entire PAM systems dysfunctional. Therefore, a solution using CMOS that overcomes such obstacles would be desirable.

Distribution of Regulated Voltages

Figure 7:
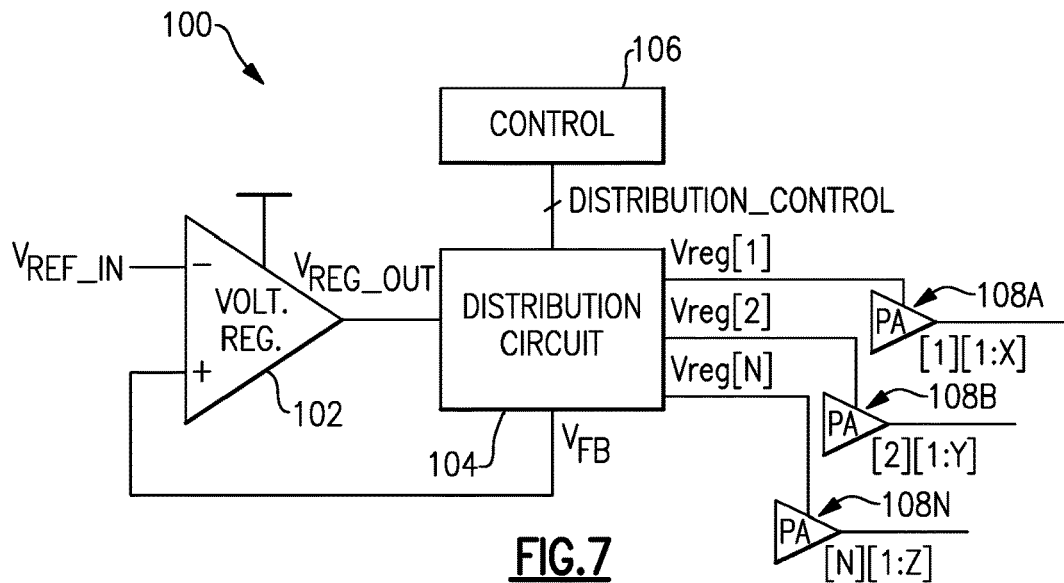
FIG. 7 is a block diagram of a circuit for distributing voltages from a single voltage regulator to a plurality of power amplifiers according to one embodiment.

FIG. 7 is a block diagram of a voltage distribution circuit 100 for distributing regulated voltages according to one embodiment. The illustrated voltage distribution circuit 100 includes a single voltage regulator 102, a distribution circuit 104, a control circuit 106, and PAs 108a-108n. The illustrated components of the distribution circuit 100 can be implemented on one or more integrated circuits using one or more semiconductor technologies. The voltage regulator 102, the distribution circuit 104, and the control circuit can be implemented, for example, as part of the PA bias control 25 (FIG. 3A), 37 (FIG. 3B) described above. The voltage distribution circuit 100 can provide a plurality of regulated voltages Vreg[1:N] to bias power amplifiers 108a-108n from the single voltage regulator 102. The voltage distribution circuit 100 can implement a function to distribute a single input reference voltage Vref_in to a plurality of regulated voltages Vreg[1:N] with the distribution circuit 104 and the control circuit 106.

The voltage regulator 102 can receive a reference voltage Vref_in, a power supply voltage, and a feedback signal Vfb as inputs and generate a regulated output voltage Vreg_out as an output. The voltage regulator 102 can compare the regulated output voltage Vreg_out to the reference voltage Vref_in and differences between the regulated output voltage Vreg_out and the fixed, internal reference voltage Vref_in can create a negative feedback loop to reduce the voltage error. The regulated output voltage Vreg_out can have a higher voltage value than the reference voltage Vref_in. The feedback signal Vfb can be a voltage provided by the distribution circuit 104. The regulated output voltage Vreg_out can be used as a stable power supply voltage, which can be independent of load impedance, input-voltage variations, temperature, and/or time. The voltage regulator 102 can include an operational amplifier, transistors, resistive elements, and/or diodes to create the regulated output voltage Vreg_out.

One characteristic of a voltage regulator is a dropout voltage. The dropout voltage can represent the difference between the output voltage and the input voltage at which a voltage regulator quits regulation with further reductions in input voltage. A dropout voltage is typically considered to be reached when the output voltage has dropped to approximately 100 mV below the nominal value. The dropout voltage, which can characterize the regulator, can depend on, for example, load current and junction temperature of a pass transistor.

The dropout voltage can divide voltage regulators into three classes: standard regulators, quasi-LDOs, and LDOs. Standard regulators can employ NPN pass transistors, and typically drop out at about 2 V. Quasi-LDO regulators can use a Darlington structure to implement a pass device made up of an NPN transistor and a PNP. The dropout voltage, $V_{SAT}(PNP)+V_{BE}$ (NPN), can typically be about 1 V. LDOs can have a dropout voltage of less than about 1 V, for example, about 100 mV to 200 mV. The voltage regulator 102 can include any of these types of voltage regulators.

Figure 9:
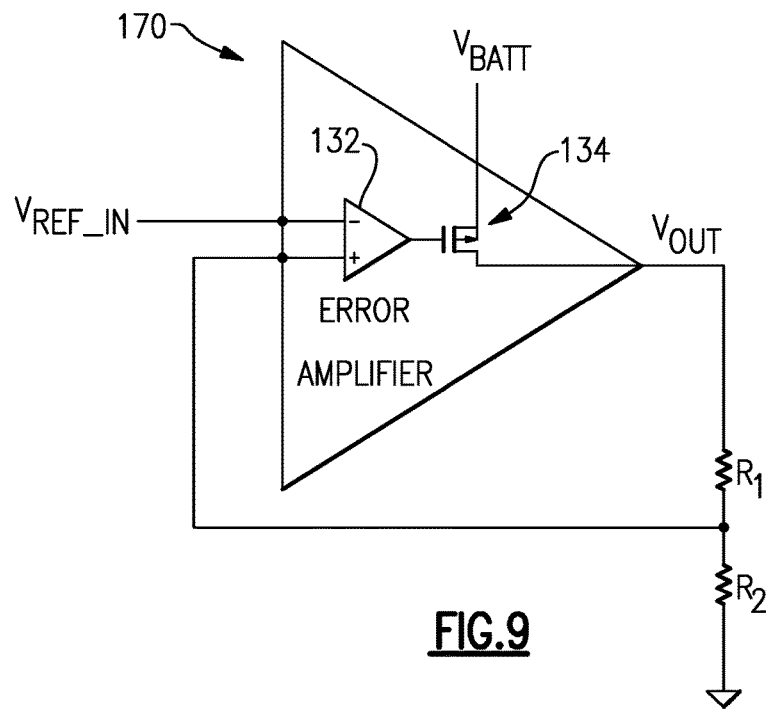
FIG. 9 illustrates an embodiment of a low-dropout regulator circuit.

Alternatively or additionally, voltage regulators can be defined by their schematic topology. As one example, LDOs can include an open collector or an open drain topology. For example, as shown in FIG. 9, the PMOS transistor 134 has a gate connected to the output of error amplifier 132, a source connected to Vbatt, and a drain that provides an output voltage Vout. Such a topology can be called an open drain circuit because the drain of the PMOS transistor 134 drives an output load. An open collector circuit is a similar topology that can use a bipolar transistor instead of a MOSFET. These topologies can enable transistor saturation in a transistor driving an LDO output and limit the voltage drop to the saturation drop. In contrast, an emitter follower topology (also referred to as a common collector) can include providing an output voltage from the emitter, in which the emitter is connected to a first end of a resistor and a second end of the resistor is connected to a power rail or ground reference. More details regarding LDOs will be provided later in connection with FIG. 9.

The reference voltage Vref_in can be a fixed internal reference voltage with a known voltage value. In one embodiment, the reference voltage Vref_in can be provided by a bandgap circuit, which is a circuit that can produce a reference voltage close to the theoretical bandgap of silicon at 0° K. In such an embodiment, the reference voltage Vreg_in can be around 1.25 V.

The power supply voltage Vbatt can be provided by a battery. Alternatively or additionally, the power supply voltage can be provided by any suitable source of a power supply. The power supply voltage Vbatt can provide a voltage of, for example, about 1.5 V to 9.0 V. In one embodiment, the power supply voltage Vbatt can be provided by a lithium ion battery having a voltage of about 4.2 V when fully charged and a voltage of about 2.7 V when almost discharged. While a battery discharges, the voltage regulator 102 can provide a constant output voltage Vreg_out of, for example, around 2.5 V. The power supply voltage Vbatt can be an upper limit on the output voltage Vreg_out.

The distribution circuit 104 can receive the regulated output voltage Vreg_out from the voltage regulator 102 and one or more distribution control signals Distribution_Control from the control circuit 106. From these inputs, the distribution circuit can provide the voltage regulator 102 with a feedback signal Vfb and provide a plurality of PAs 108a-108n with a plurality of regulated voltages Vreg[1:N]. Each of the regulated voltages Vreg[1:N] can be provided to one or more of the PAs 108a-108n or individual stages of the PAs108a-108n. For example, in one embodiment, a PA can comprise two or more stages and two or more of the stages can receive different regulated voltages. From such a PA, outputs from different stages can be used for different purposes, for example, different power modes as will be described with more detail in connection with FIG. 15. The distribution can comprises switches, such as transistors, or any suitable distribution elements operative to distribute accurate regulated output voltages. More detail regarding a particular embodiment of the distribution circuit 104 will be provided in connection with FIGS. 8A-8C.

The control circuit 106 can provide the distribution circuit 104 with one or more distribution control signals Distribution_Control. The distribution control signals Distribution_Control can selectively control the regulated voltages Vreg[1:N] based on desired operation of the PAs 108a-108n. For example, the distribution control signals Distribution_Control can adjust outputs of the distribution circuit 104 to enable/disable certain PAs and/or based on voltage levels desired for different power modes. More detail regarding particular embodiments of the control circuit 106 will be provided in connection with FIGS. 8A-8C.

Figure 15:
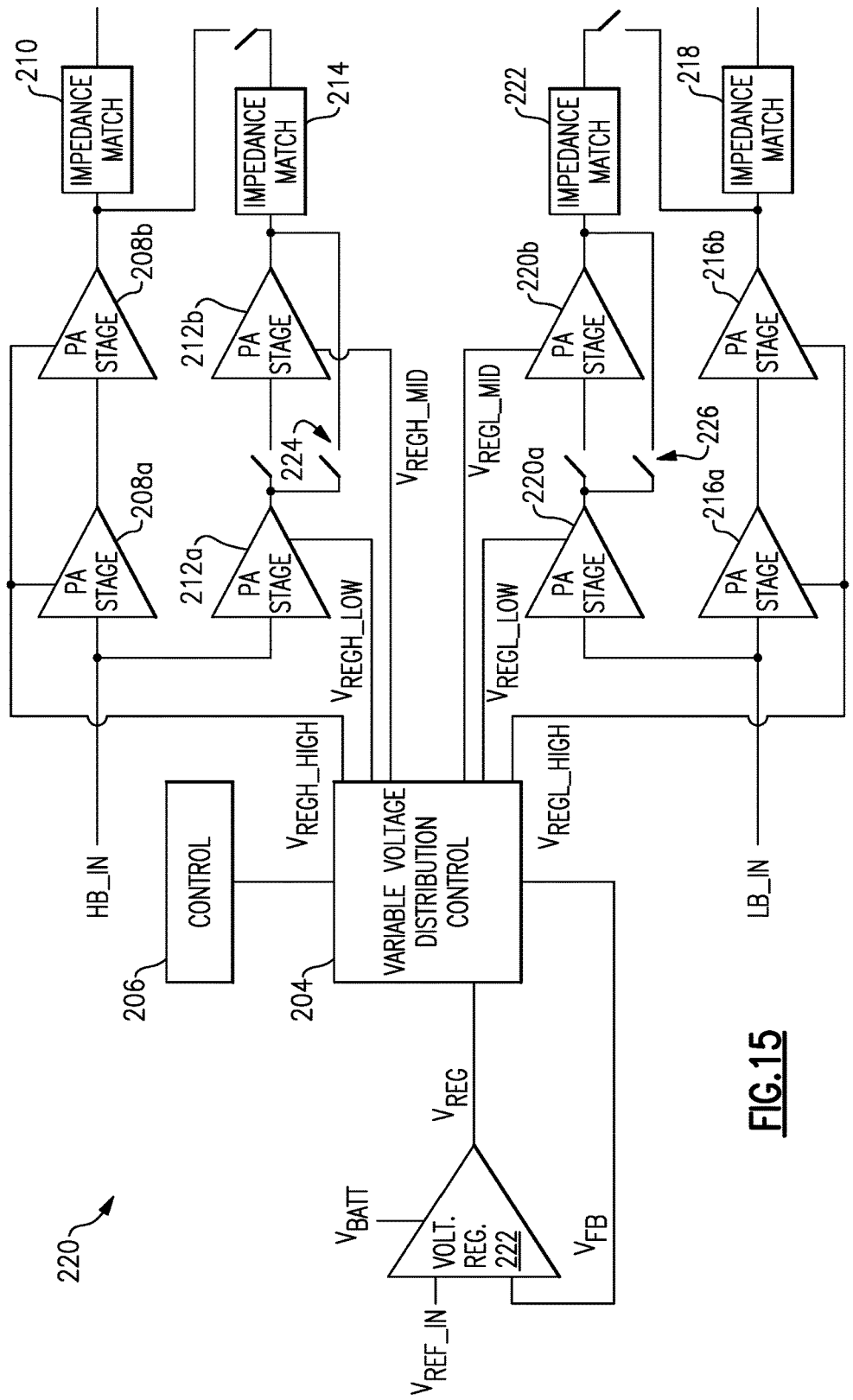
FIG. 15 illustrates an electronic system that includes a variable voltage distribution function according to one embodiment.

The plurality of PAs 108a-108n can use the regulated voltages Vreg[1:N] as bias signals in amplifying signals for transmission. The plurality of PAs 108a-108n can implement any of the PAs described above, for example, with reference to FIGS. 2, 3A, 3B, 4A, 4B. Each of the illustrated PAs 108a-108n can represent one or more PAs. In addition, one or more of the PAs 108a-108n can include two or more stages that can receive different regulated voltages provided by the distribution circuit 104. This feature is illustrated in FIG. 15.

One or more of the plurality of PAs 108a-108n can be implemented on either the same integrated circuit and/or a different integrated circuit than the distribution circuit 104 and/or the control circuit 106, for example, as shown in FIGS. 3A and 3B. One or more of the PAs 108a-108n can be implemented in a different technology than the distribution circuit 104. For example, the distribution circuit 104 can be implemented in a silicon CMOS technology and one or more of the PAs 108a-108n can be implemented in, for example, GaAs pHEMPT or BiFET technologies. This can be advantageous because certain applications, such as PAM RF switches, can be better implemented in GaAs pHEMPT or BiFET, while the characteristics of less expensive CMOS technology can provide the required characteristics of the distribution circuit 104.

Figure 8A:
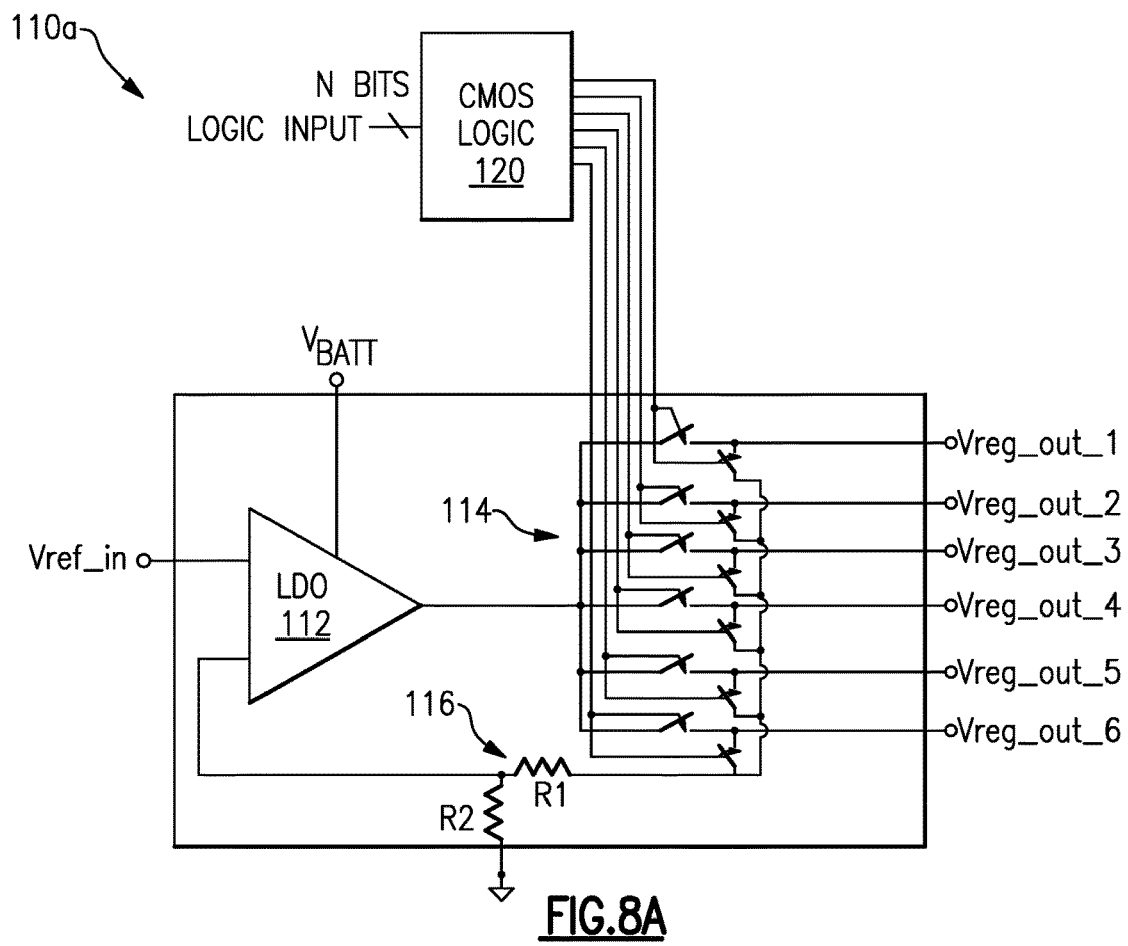
FIGS. 8A-8C illustrate block diagrams for distributing regulated voltages from a single low-dropout regulator according to certain embodiments.
Figure 8B:
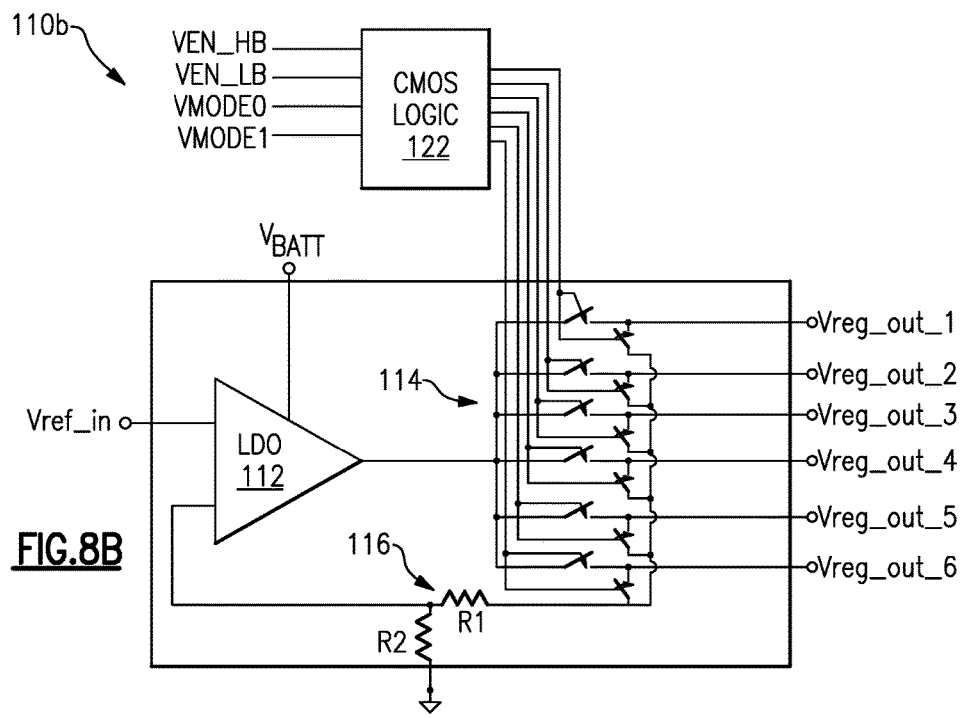
Figure 8C:
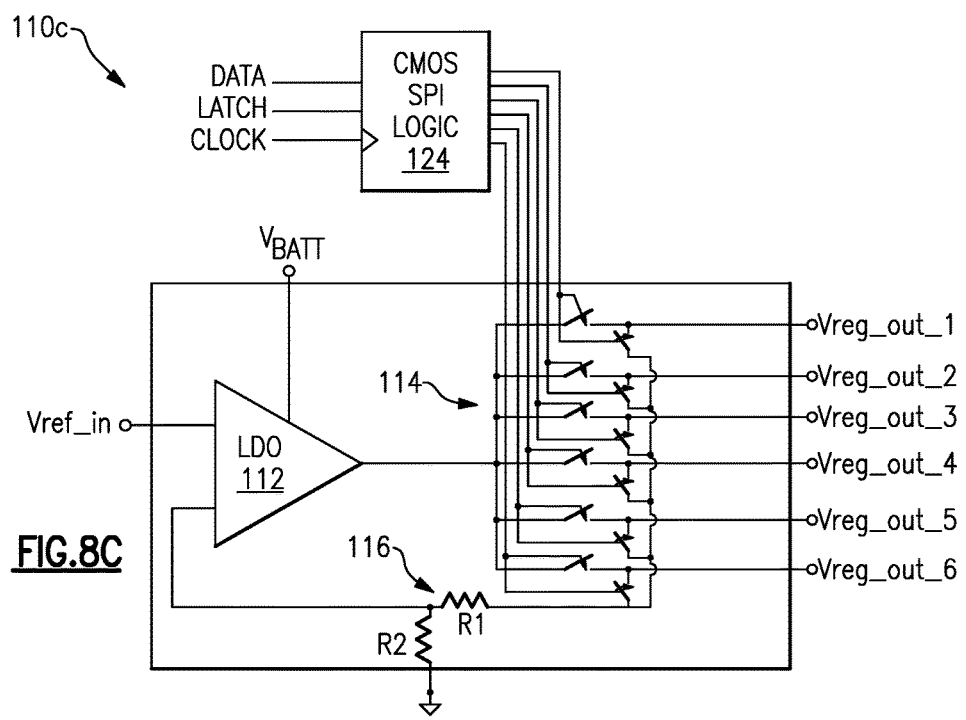

FIGS. 8A-8C illustrate functional block diagrams for distributing regulated voltages from a single voltage regulator according to certain embodiments. Voltage distribution systems 110A, 110B, 110C illustrate three different ways of controlling voltage distribution. The voltage distribution systems 110A, 110B, 110C each include a single LDO 112, distribution elements 114, feedback elements 116, and control circuits 120, 122, 124. These systems can be used, for example, to distribute a single regulated output voltage to each of a plurality of PA bias references.

The single LDO 112 is an example of the voltage regulator 102 (FIG. 7) and can implement any combination of the functionality described above with reference to the voltage regulator 102. The single LDO 112 can be used to provide a stable power supply voltage independent of load impedance, input-voltage variations, temperature, and time. As described above, an LDO can be defined by a dropout voltage and/or schematic topology. LDOs can have a lower dropout voltage and dissipation than quasi-LDOs or standard voltage regulators, and thus can be more efficient. In some embodiments, LDOs can have lower maximum input voltage specifications than standard voltage regulators and/or can require certain external capacitors to maintain stability.

LDOs can maintain voltage regulation with small differences between supply voltage and load voltage. For example, a lithium-ion battery can drop from about 4.2 V (fully charged) to about 2.7 V (almost discharged) and an LDO can maintain a constant voltage of approximately 2.5 V at the load. Advantageously, an LDO can be used in any equipment that needs constant and stable voltage, while minimizing the upstream supply and/or working with wide fluctuations in upstream supply. Typical examples of circuits that can receive the LDO output include without limitation circuitry with digital or RF loads. For example, LDOs can be used in portable applications to maintain the required system voltage independent of the state of battery charge.

The LDO 112 can be a "linear" series voltage regulator. Such voltage regulators typically include an input configured to receive a reference voltage, a means of scaling the output voltage and comparing it to the reference, a feedback amplifier, and a series pass transistor (bipolar or FET) with a voltage drop that can be controlled by the amplifier to maintain the output at the required value. For example, if the load current decreases, causing the output to rise incrementally, the error voltage can increase, the amplifier output can rise, the voltage across the pass transistor can increase, and the output can return to its original value.

One or more of the PAs 108a-108n can be implemented in a different technology than the LDO 112. For example, LDO 112 can be implemented in CMOS technology, such as bulk CMOS, and one or more of the PAs 108a-108n can be implemented in, for example, GaAs pHEMPT or BiFET technologies. Alternatively or additionally, one or more of the PAs 108a-108n can be implemented in the same technology as the LDO 112, for example, CMOS, GaAs pHEMPT, or BiFET technologies.

One embodiment of the LDO 112 is provided in FIG. 9. LDO 130 can include an error amplifier 132 and a PMOS pass transistor 134. The error amplifier 132 and the PMOS pass transistor 134 can form a voltage-controlled current source. The error amplifier 132 can include a positive input terminal connected to Vref_in, a negative input terminal, and an output. The PMOS pass transistor 134 can include a gate, a source, and a drain. As illustrated in FIG. 9, the gate of the PMOS pass transistor 134 can be connected to the output of the error amplifier 132, the source can be connected to a battery voltage Vbatt, and the drain can provide an output voltage Vout. The output voltage Vout can be provided to one or more loads, such as a bias input to a PA, and a high gain feedback loop. In one embodiment, the high gain feedback loop can include distribution elements 136. This can be advantageous because by integrating the distribution network 136 into the LDO feedback path the circuit can better compensate for process, temperature, and supply variations, and thus increase the accuracy of the regulated voltages provided. Accordingly, in this embodiment, the distribution elements 136 may not introduce additional variation in regulated voltages provided to loads, such as PAs.

In the feedback loop, the output voltage Vout can be scaled down by the voltage divider that includes resistors R1, R2. A first end of a first resistor R1 can be connected to the drain of PMOS pass transistor 134. A second end of the first resistor R1 can be connected to the first end of the second resistor R2 and the positive input of the error amplifier 132. The second end of the second resistor R2 can be connected to ground. The first resistor R1 and the second resistor R2 can correspond to the feedback elements 116 of FIGS. 8A-8C. The values of the first resistor R1 and the second resistor R2 can be selected to set the gain of the LDO. For example, the output voltage Vout can be represented by the following equation:

$$Vout=Vref\_in+Vref\_in*R1/R2$$

In the embodiment shown in FIG. 9, the pass device 136 is a PMOS transistor. However, a variety of pass devices can be used in LDOs based on a desired application. Examples of other types of pass devices can include without limitation NPN bipolar transistors, PNP bipolar transistors, and Darlington circuits. For a given supply voltage, bipolar pass devices can deliver the highest output current in certain embodiments. In some applications, a PNP can be preferred to an NPN, because the base of the PNP can be pulled to ground, fully saturating the transistor if necessary. Typically, the base of the NPN can only be pulled as high as the supply voltage, limiting the minimum voltage drop to the voltage difference between the base and the emitter $V_{BE}$. As a result, NPN and Darlington pass devices are typically used in applications with dropout voltages of 1 V or more, which are not typically considered LDO devices. Yet in other embodiments, NPN and Darlington pass devices can be used to implement dropout voltages of LDOs. NPN and Darlington pass devices can be desirable in applications where wide bandwidth and immunity to capacitive loading are necessary, as they typically have characteristically low output impedance. PMOS and PNP transistors can be effectively saturated in LDOs, thereby minimizing the voltage loss and the power dissipated by the pass device, thus allowing low dropout, high-efficiency voltage regulators. PMOS pass devices can provide a lower dropout voltage than PNP transistors, approximately $R_{DS(ON)} \times I_L$ in some embodiments. PMOS pass devices can also allow the quiescent current flow to be minimized. A typical drawback of using a MOS transistor is that it has been implemented as an external component, especially for controlling high currents. This can result in making the IC a controller, rather than a complete self-contained regulator.

Referring back to FIGS. 8A-8C, the output Vreg_out of the single LDO 112 can be provided to distribution elements 114. The distribution elements 114 are one exemplary embodiment of the distribution circuit 104 (FIG. 7).

The distribution elements 114 can include a transmission gate voltage distribution network of switches. In response to signals provided by a control circuit 120, 122, 124, the distribution elements can selectively provide regulated output voltages to a plurality of different loads by turning switches "On" or "Off." For example, one or more of the transmission switches can turn "On" and connect the output of the LDO 112 Vreg_out to one or more of regulated output voltages Vreg_out1-Vreg_out6. Alternatively or additionally, one or more of the transmission switches can turn "Off" and disable the connection between the output of the LDO 112 Vreg_out and one or more of the regulated output voltages Vreg_out1-Vreg_out6.

The distribution elements 114 can also include switches to close a feedback loop to the positive terminal of the LDO 112. Each of the switches can connect one of the distributed regulated output voltages Vreg_out1-Vreg_out6 to the feedback elements 116, for example, the first end of resistor R1. In one embodiment, these switches can be selectively controlled to close the feedback loop when a corresponding transmission switch turns "On" to provide a regulated output voltage. Closing the feedback loop can compensate for process, supply, and temperature variations, integrating the distribution network so that it can be included within a high gain feedback loop. Thus, the distribution elements 114 can reduce or minimize output voltage errors by integrating the user-defined, digitally selected functionality within the feedback loop for an error amplifier in LDO 112.

The distribution elements 114 can include transistors, such as MOSFETs and/or bipolar transistors. In one embodiment, the transistors can be NMOS devices. Such NMOS devices can be formed using a bulk CMOS process technology, for example. These devices can supply specified temperature-compensated bias voltages to output loads. For example, in one embodiment, such bias voltages can be provided to the one or more GaAs PAs on a separate die while corresponding distribution elements 114 are in the "On" state and bias voltages are not supplied to one or more unused PAs when corresponding distribution elements 114 are in the "Off" state. When distribution elements are in the "Off" state, the bias voltages can be biased to 0 V or ground with a shunt NFET device. In some embodiments, one or more of the regulated output voltages Vreg_out1-Vreg_out6 can be connected to a bias input of a current mirror of a PA. The current mirror can bring the current inside the PA close to zero as the input discharges.

While six regulated output voltages are illustrated in FIGS. 8A-8C, two or more regulated output voltages can be provided using distribution elements 114 and a single LDO 112. Considerations such as fanout, wire routing, and/or a number of pins, for example, can limit the number of regulated voltages provided by a single LDO 112. In one embodiment, from 1 to 32 regulated output voltages can be provided by a single LDO 112.

FIGS. 8A-8C provide three different control circuits 120, 122, 124, respectively, for the distribution elements 114. These control circuits can be implemented in the digital domain. The control circuit 106 (FIG. 6) can implement any combination of the features described below in reference to FIGS. 8A-8C.

Referring to FIG. 8A, the control circuit 120 can include CMOS logic. The control circuit 120 can selectively control the distribution of the regulated voltage provided by the LDO 112 to implement a variety of functionalities related to enabling and disabling voltage distribution including without limitation enabling data paths that generate signals within different frequency bands and enabling different modes of operation, such as power modes and/or controlling power of one or more PAs in specific modes of operation. N bits of logic input can be provided to the control circuit 120. From the logic input, the control circuit 120 can generate a control signal for each of the distribution elements 114. In other embodiments, one or more of the distribution elements can share the same control signal. For example, the transmission switch and feedback switch for the same regulated output voltage can receive the same control signal, as illustrated in FIG. 8A. As another example, transmission gates for two of the regulated output voltages can share the same control signal if they are enabled at the same time. The control circuit 120 can include without limitation inverters, NAND gates, NOR gates, XOR gates, pass gates, and the like to implement logic functions to selectively control distribution elements 114. The control circuit 120 can include static CMOS logic and/or dynamic CMOS logic.

FIG. 8B provides another example control circuit 122. The control circuit 122 is a more specific example of the control circuit 120 and can implement any combination of the functions for the control circuit 120 described above. The control circuit 122 receives enable inputs Ven_HB, Ven_LB and mode inputs Vmode0, Vmode1 and provides outputs for each of the distribution elements 114.

The enable inputs Ven_HB, Ven_LB can selectively control the distribution elements 114 such that regulated voltages are only provided to circuits driving certain frequency bands. This can be advantageous for parts made for more than one application. For example, mobile devices, such as cellular telephones, can operate in accordance with different standards that operate in different frequency bands. A part that can selectively control can different circuits that process signals with different frequency bands can be used in multiple applications, without burning excess power from additional switching and leakage current. Moreover, such parts can also be used in devices that can operate under two or more standards operating within different frequency bands.

In one embodiment, Vreg_out1-Vreg_out3 can be provided to bias inputs of PAs used to generate high band signals and Vreg_out4-Vreg_out6 can be provided to bias inputs of PAs used to generate low band signals, for example, as described later in connection with FIG. 15. For example, based on the state of Ven_HB, high band PAs can be enabled or disabled by turning one or more of the distribution elements 114 "On" or "Off." Similarly, as another example, based on the state of Ven_LB, low band PAs can be enabled or disabled. This idea can be applied to two or more different transmission bands. Advantageously, selectively enabling and disabling different frequency bands can result in substantial power savings and/or reduce the need for separate voltage regulators and additional wiring routing for each power mode.

The mode inputs can selectively control the distribution elements 114 such that certain circuit elements are enabled or disabled in certain power modes. This function can be implemented alternatively or in addition to the band enable functionality described above. For example, the mode inputs Vmode0, Vmode1 can uniquely identify four different power modes, although this idea can be applied to more than four different power modes. In one embodiment, the state of the mode inputs Vmode0, Vmode1 can represent a low power mode, a medium power mode, and a high power mode. In this embodiment, one or more of the regulated output voltages Vreg_out1-Vreg_out6 can be provided based on the power mode. For example, the following table summarizes which regulated output voltages are provided via the distribution elements according to which band is enabled and the power mode, in one embodiment.

TABLE 1

| Band, Mode | Regulated Output Voltage Provided |
| --- | --- |
| High Band, High Power | Vreg_out1 |
| High Band, Medium Power | Vreg_out2, Vreg_out3 |
| High Band, Low Power | Vreg_out3 |
| Low Band, High Power | Vreg_out4 |
| Low Band, Medium Power | Vreg_out5, Vreg_out6 |
| Low Band, Low Power | Vreg_out6 |

FIG. 8C provides another example control circuit 124. The control circuit 124 includes serial peripheral interface bus (SPI) logic. The control circuit 124 receives data, latch and clock inputs and provides outputs for each of the distribution elements 114. SPI can provide a synchronous serial data link standard that operates in full duplex mode. Devices can communicate in master/slave mode when the master device initiates a data frame. A plurality of slave devices can include individual select lines to selectively control outputs.

Variable Control of Regulated Voltage

As discussed above, multiple voltage references can be used to create different quiescent bias points depending upon specific applications. Adjusting regulated voltage from a single voltage regulated based on the need for different reference voltages can eliminate the need for additional voltage regulators for specific needs, such as operating in a desired power mode. At the same time, industry specifications for quiescent current in each power mode for PAMs can be aggressive, especially for PAs used in RF applications. Advantageously, regulated voltages can be changed to provide different quiescent currents to some of the PA bias inputs based on a chosen power mode.

Figure 10:
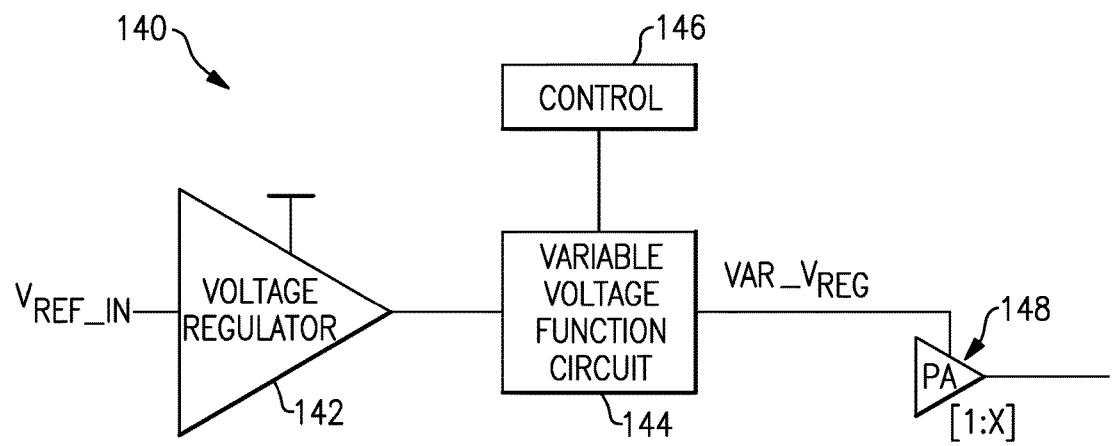
FIG. 10 is a block diagram of a circuit for providing a variable voltage from a voltage regulator a plurality of power amplifiers according to one embodiment.

FIG. 10 is a block diagram of a circuit for providing a variable voltage from a voltage regulator to a plurality of power amplifiers according to one embodiment. The illustrated variable voltage circuit 140 includes a single voltage regulator 142, a distribution circuit 144, a control circuit 146, and one or more PAs 148. The illustrated components of the distribution circuit 140 can be implemented on one or more integrated circuits using one or more semiconductor technologies. The voltage regulator 142, the distribution circuit 144, and the control circuit can be implemented, for example, as part of the PA bias control 25 (FIG. 3A), 37 (FIG. 3B) described above. The voltage distribution circuit 140 can provide a variable regulated voltage to bias one ore more PAs 148 using the single voltage regulator 142. The voltage distribution circuit 140 can implement a function to adjust a single input reference voltage Vref_in to a desired regulated voltage level Var_Vreg with the variable voltage function circuit 144 and the control circuit 146.

The voltage regulator 142 can receive a reference voltage Vref_in and a power supply voltage Vbatt as inputs and generate a regulated output voltage Vreg_out as an output. The voltage regulator 142 can implement any combination of functions of the voltage regulator 102 (FIG. 7), except that the voltage regulator 142 does not receive feedback from a voltage distribution circuit. In addition, the voltage regulator 142 can be used in any of the applications described above in reference to the voltage regulator 102 (FIG. 7). In one embodiment, the voltage regulator 142 can include an LDO. In such an embodiment, the voltage regulator 142 can implement any combination of features described above in reference to FIG. 9.

The variable voltage function circuit 144 can receive the regulated output voltage Vreg_out from the voltage regulator 142 and one or more variable voltage control signals from the control circuit 146. From these inputs, the variable voltage function circuit 144 can adjust the regulated voltage Vreg_out provided by the voltage regulator 142 and provide the one or more PAs 148 and/or individual stages of the PAs 148 with a variable regulated voltage Var_Vreg. By providing a variable voltage function with a single LDO, one LDO can be used to supply multiple accurate voltage values, instead of using separate LDOs for each voltage value. This can help to reduce current, area consumption, and overall design complexity.

The variable voltage function circuit 144 can include variable voltage control elements, such as variable resistive elements. More detail regarding a particular embodiment of the variable voltage circuit 144 will be provided later in reference to FIG. 11.

The control circuit 146 can provide the variable voltage function circuit 144 with one or more variable control signals. The variable voltage control signal(s) can selectively control the variable regulated voltage Var_Reg based on desired operation of the PA 148. For example, the voltage control signal(s) can adjust outputs of the variable voltage function circuit 144 based on voltage levels desired for different power modes. Thus, aggressive industry specifications for quiescent current in each power mode for a PAM can be met using a single LDO. The variable voltage control signal(s) can be analog or digital. The control 146 circuit can be implemented in a variety of process technologies, for example, CMOS, and in some embodiments bulk CMOS silicon technology.

The one or more PAs 148 receive the variable regulated voltage Var_Vreg as bias signals in amplifying signals for transmission. The one or more PAs 148 can implement any combination of features of the power amplifiers described above, for example, with reference to FIGS. 2, 3A, 3B, 4A, 4B. Like the embodiments shown in FIGS. 3A and 3B, one or more of PAs 148 can be implemented on either the same integrated circuit and/or a different integrated circuit than the variable voltage function circuit 144 and/or the control circuit 146. The one or more of the PAs 148 can be implemented in a different technology than the distribution circuit 104. For example, the variable voltage function circuit 144 can be implemented in CMOS technology and one or more of the PAs 148 can be implemented in, for example, GaAs pHEMPT or BiFET technologies. This can be advantageous because certain applications, such as PAM RF switches, can be better implemented in GaAs pHEMPT or BiFET, while the characteristics of less expensive CMOS technology can provide the required characteristics of the variable voltage function circuit 144.

Figure 11:
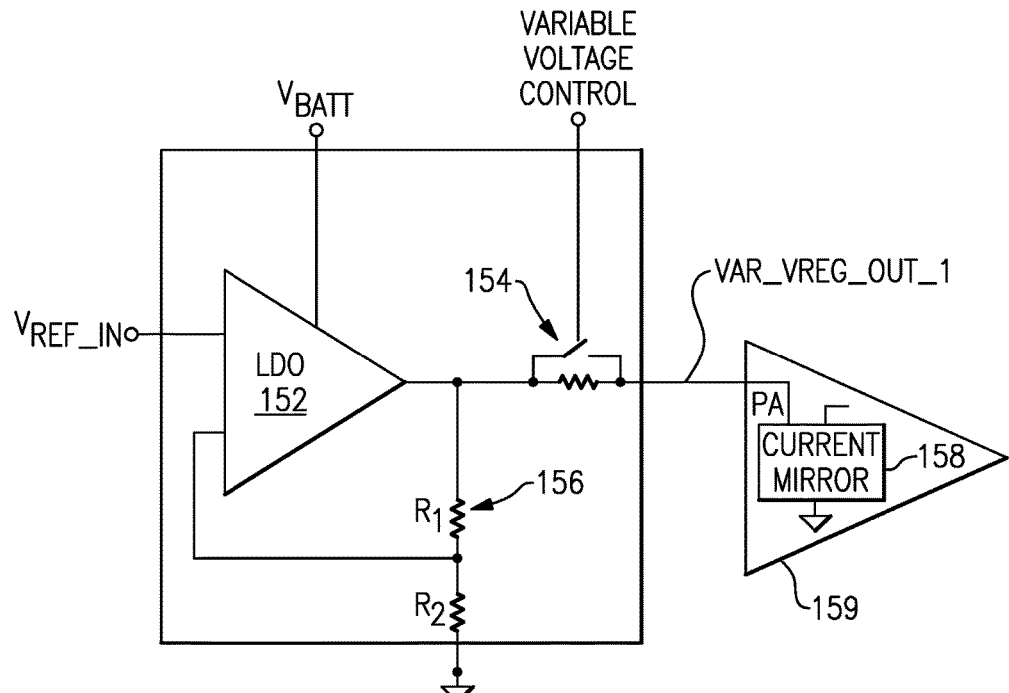
FIG. 11 is a block diagram for generating a variable voltage from a single low-dropout regulator according to one embodiment.

FIG. 11 is a functional block diagram for generating a variable voltage from a single low-dropout regulator according to one embodiment. The variable voltage system 150 can include a single LDO 152, one or more variable voltage control elements 154, and feedback elements 156. The variable voltage system 150 can be used, for example, to provide a variable regulated voltage Var_Vreg_out to a load, such a current mirror 158 in a PA 159. Like the variable voltage control circuit 144 and the PA 148, the variable voltage elements 154 can be implemented in one or more integrated circuits and in one or more process technologies. This can provide different regulated voltage levels to the load in response to the variable voltage control signal. The variable voltage system 150 can be implemented in bulk CMOS silicon technology.

The single LDO 152 is an example of the voltage regulator 142 (FIG. 10) and can implement any combination of the functionality described above with reference to the voltage regulator 142 or 102 (FIG. 7). In addition, the LDO 152 can implement any combination of features of the LDO 112 (FIG. 9), except that the LDO 152 does not include a distribution circuit in the feedback loop to the positive terminal of the error amplifier. The single LDO 152 can be used to provide a stable power supply voltage independent of load impedance, input-voltage variations, temperature, and time.

The variable voltage element 154 can receive the regulated voltage output of the LDO 152 and provide a variable regulated output voltage based on a variable voltage control input. The variable voltage element 154 can include any circuit elements that can provide a variable voltage that results in a variable quiescent current provided to a load, for example, the current mirror 158 in PA 159. The variable voltage element may include elements that vary resistance. As illustrated, the variable voltage control element 154 can include a resistive switching network that includes a resistor in parallel with a FET. The amount of current passes through the FET can change in response to the Variable Voltage Control, thereby adjusting the voltage level of Var_Vreg_Out. In another embodiment, the variable voltage control element can be a long channel FET with a variable gate voltage that can implement a variable resistor. In yet another embodiment, the variable voltage control element can include two or more relatively weak FETs and use the variable voltage control to provide different voltage levels by selectively turning a predetermined number of the relatively weak transistors "On."

Thus, in one embodiment, the variable voltage system 150 can create different bias voltages based on the amount of current required in a PA reference current mirror 158. Advantageously, the variable voltage system 150 can be implemented in bulk CMOS and the PA 159 can be implemented in GaAs. Such an implementation can reduce area consumption and lower cost by allowing the removal of additional elements, such as surface mount devices (SMDs), from the more expensive GaAs substrate.

Distribution of Variable Regulated Voltages

Figure 12:
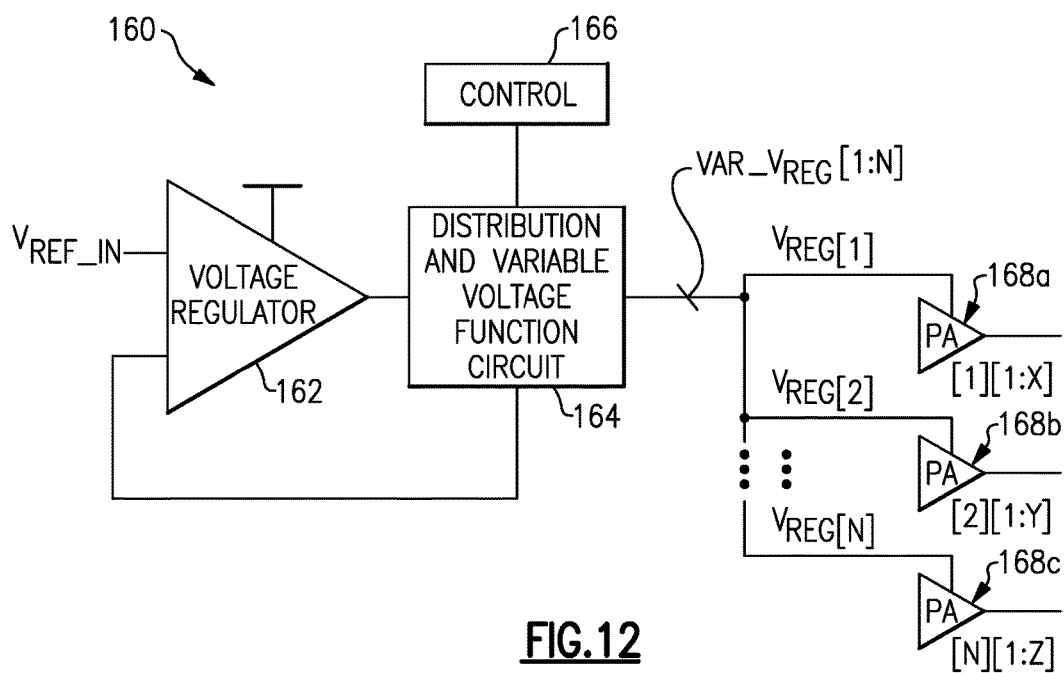
FIG. 12 is a block diagram of a circuit for distributing variable, regulated voltages from a single voltage regulator according to one embodiment.

FIG. 12 is a block diagram of a circuit 160 for distributing variable, regulated voltages from a voltage regulator according to one embodiment. The illustrated variable voltage distribution circuit 160 includes a single voltage regulator 162, a variable voltage distribution circuit 164, a control circuit 166, and PAs 168a-168n. The illustrated components of the variable voltage distribution circuit 160 can implement any combination of the distribution and/or variable voltage functions described above, for example, in reference to FIGS. 7 and 10. The variable voltage distribution circuit 160 can provide a plurality of variable regulated voltages Var_Vreg[1:N] to bias power amplifiers 168a-168n from the single voltage regulator 162. The voltage distribution circuit 160 can implement a function to distribute a single input reference voltage Vref_in to a plurality of variavle regulated voltages Var_Vreg[1:N] with the variable voltage distribution circuit 164 and the control circuit 166, using any combination of the features described above.

Figure 13:
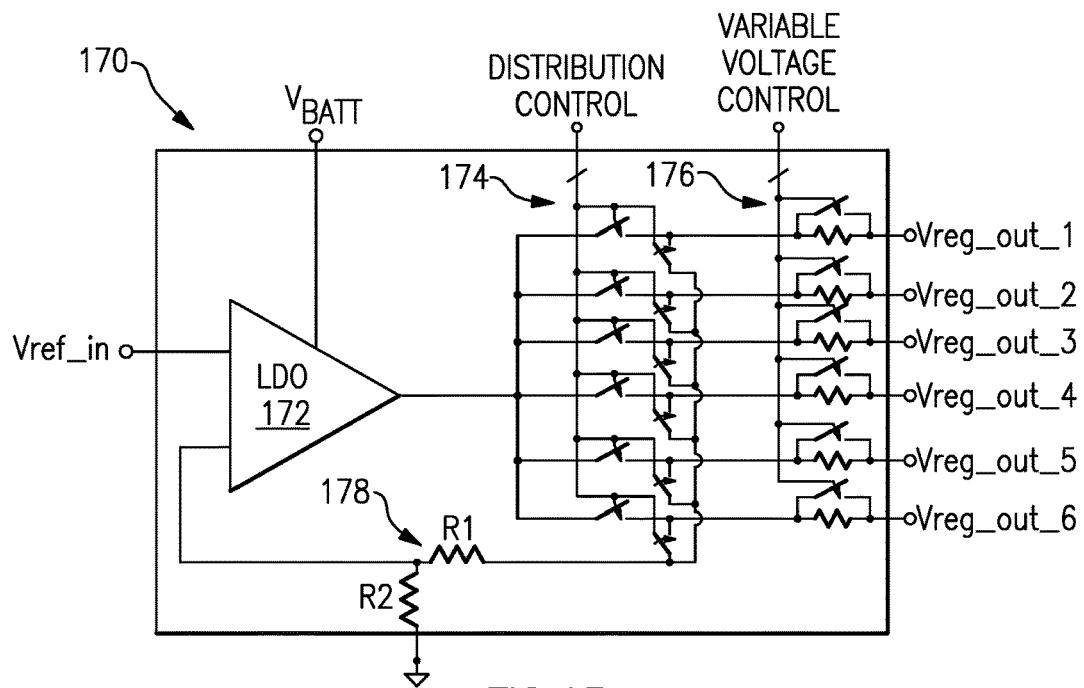
FIG. 13 is a block diagram for distributing variable voltages from a single low-dropout regulator according to one embodiment.

FIG. 13 is a block diagram for distributing variable voltages from a single low-dropout regulator according to one embodiment. Variable voltage distribution system 170 can include a single LDO 172, one or more distribution elements 174, one or more variable voltage control elements 176, and feedback elements 178. The variable voltage distribution system 170 can implement any combination of features described above related to voltage distribution or variable voltage control, for example, in the voltage distribution systems 110A, 110B, 110C (FIGS. 8A-8C) or the variable voltage system 150 (FIG. 11). The variable voltage distribution system 150 can provide a plurality of variable regulated voltages Var_Vreg_out1-Var_Vreg_out6 to various loads, such as PAs.

Combining voltage distribution and variable voltage control can allow for distribution of accurate voltages as programmed by a user from the single LDO 172. This combination can result in even greater savings in die area, lower current consumption, and reduced design complexity compared to implementing voltage distribution and voltage variation separately. In addition, variable voltage distribution can provide additional flexibility for future architectural changes or functionality.

The variable voltage distribution system 150 can provide different quiescent bias currents based on desired power modes, along with distributing a single regulated output voltage to different loads by selectively enabling and disabling distribution of regulated voltage to the different loads.

More detail about one example implementation of the variable voltage distribution system 150 in provided in connection with FIG. 15.

The distribution elements 174 can comprise one or more switches that pass a regulated voltage to a variable voltage control element 176 when the switches are "On." In one embodiment, there is one switch connected to each variable voltage control element 176. In another embodiment, one or more variable voltage control elements 176 can be connected to switches and one or more variable voltage control elements can be connected directly to the output of the LDO 172.

As shown in FIG. 13, the distribution elements 174 can be connected to the output of the LDO 172 and can pass current to the variable voltage control elements 176. The variable voltage control elements can then adjust the regulated voltages and provide variable regulated voltages to loads, such as PAs. It can be advantageous to include one or more of the distribution elements 174 in a feedback loop with the LDO 172, which can include feedback elements 178. This can compensate for process, supply, and temperature variations that can be introduced by the distribution elements. Thus, variable regulated output voltages can provide regulated voltages that can compensate for process, supply, and temperature variation.

In another embodiment, the output of the LDO can be connected to variable voltage control elements. The variable voltage control elements can then provide variable voltages to distribution elements that can selectively provide variable regulated voltages to loads, such as PAs. In this embodiment, a feedback loop with the LDO can include switches that match corresponding switches in the distribution elements, for example, by being formed on the same integrated circuit with similar layouts. In this way, the feedback loop take the output of the LDO, before adjustment by the variable voltage control elements, and compensate for process, supply, and temperature variation.

In addition, a user-defined functionality can be integrated within the feedback loop to the error amplifier in the LDO, thereby allowing for reduction or minimization of output voltage errors. The user defined function can be implemented in digital distribution control signals, for example. In such an implementation, a highly reliable mixed signal approach can be implemented to distribute the variable regulated voltages, for example, to PA bias inputs.

The variable LDO output voltage function can be outside the compensation loop of the LDO error amplifier. To effectively compensate for process, supply, and temperature variations while minimizing current and area consumption, the voltage distribution function can be utilized with the variable voltage function to distribute an array of variable reference voltages. In one embodiment, both distribution and variable voltage control functions can offer the flexibility to distribute different voltage levels to multiple loads (for example, PA stages) utilizing a single LDO output reference.

Figure 14A:
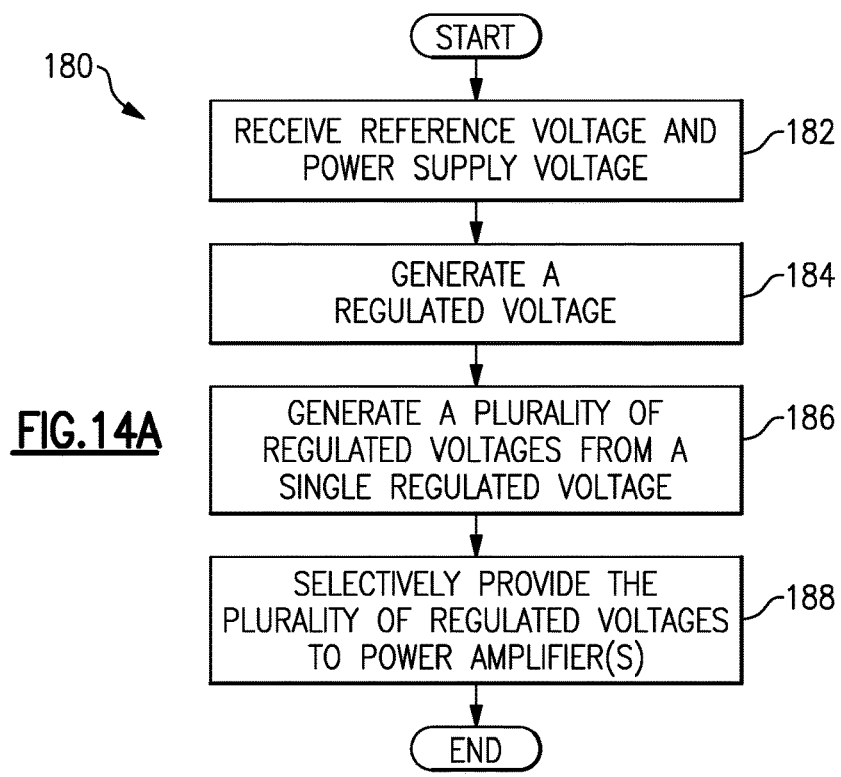
FIG. 14A shows a process of providing a plurality of regulated voltages from a single regulated voltage.

FIG. 14A shows a process 180 of providing a plurality of regulated voltages from a single regulated voltage. The process 180 can be performed in a variety of applications, such as providing an accurate quiescent current for PAs. For example, the plurality of regulated voltages provided by the process 180 can be used to bias the PA systems described above in reference to FIGS. 3A-3B.

At block 182, a reference voltage and a battery voltage are received. The reference voltage can be a constant, known voltage value. The battery voltage can be provided by a battery or any other suitable power supply. The battery voltage can change over time. For example, as a battery discharges, the battery typically provides a lower voltage.

Because the battery voltage can change, it may not be suitable for certain applications that require a constant voltage. Accordingly, a regulated voltage can be generated at block 184. The regulated voltage can provide an accurate voltage based at least in part on the reference voltage and the battery voltage. In one embodiment, the regulated voltage can be generated using an operational amplifier with a feedback loop.

A plurality of regulated voltage can be generated from the regulated voltage at block 186. This can provide multiple accurate, regulated voltages to circuits that require such voltage signals. Accordingly, a single voltage regulator can provide multiple loads with regulated voltages, saving area, reducing power consumption, and improving scalability, among other advantages.

The plurality of regulated voltages can selectively be provided to one or more loads, such as PAs or PA stages, at block 188. In one embodiment, two or more loads can be provided with regulated voltages concurrently. The components used to selectively provide the regulated voltages can provide feedback information that can help to keep the generated regulated voltage at a stable, accurate value at block 184. The loads can be on either the same die or a different die than the components that create the regulated voltage. Alternatively or additionally, the loads can be created using either the process technology or a different technology than the components that create the regulated voltage.

The plurality of regulated voltages can be selectively provided to different loads to enable or disable certain circuit elements at block 188. For example, certain loads can be provided with regulated voltages in certain modes of operation, such as power modes, to generate signals within predefined frequency bands, to comply with different standards, and/or to generate signals for certain applications.

Figure 14B:
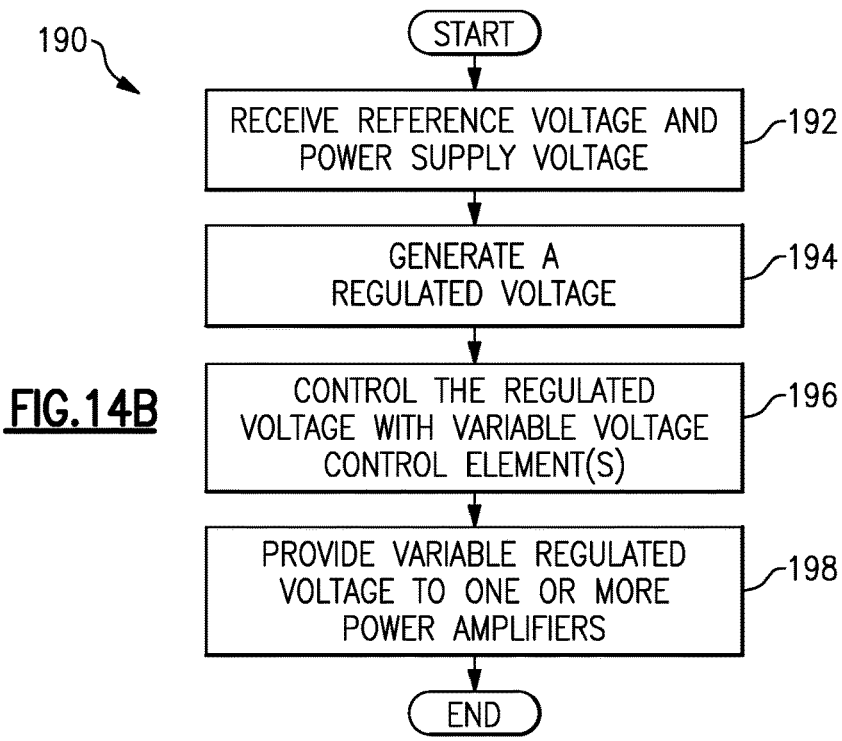
FIG. 14B shows a process of providing a variable regulated voltage from a single regulated voltage.

FIG. 14B shows a process 190 of providing a variable regulated voltage from a single regulated voltage. The process 190 can be performed in a variety of applications, such as providing an accurate quiescent current for PAs. For example, different voltage levels provided by the process 190 can be used to bias the PA systems described above in reference to FIGS. 3A-3B to different voltages.

The process 190 is similar to the process 180, except that variable regulated voltages are implemented instead of a plurality of regulated voltages. Accordingly, blocks 192 and 194 can implement any combination of the functions described above in reference to blocks 182 and 184.

The regulated voltage generated at block 194 can be controlled using one or more variable voltage control elements at block 186. This can provide multiple accurate, regulated voltage levels to circuits that can benefit from such voltage signals. Accordingly, a single voltage regulator can provide one or more loads with a variable regulated voltage, instead of using separate voltage regulators for each desired voltage level. This can result in saving area, reducing power consumption, and improving scalability, among other advantages.

The variable regulated voltage can be provided to one or more loads, such as PAs or PA stages, at block 198. The variable regulated voltage can be provided to loads to adjust the amount of quiescent current provided. For example, the loads can be provided with different voltages in certain modes of operation, such as power modes, to comply with different standards, and/or to generate signals for certain applications. The loads can be on either the same die or a different die than the components that create the regulated voltage. Alternatively or additionally, the loads can be created using either the process technology or a different technology than the components that create the regulated voltage.

Figure 14C:
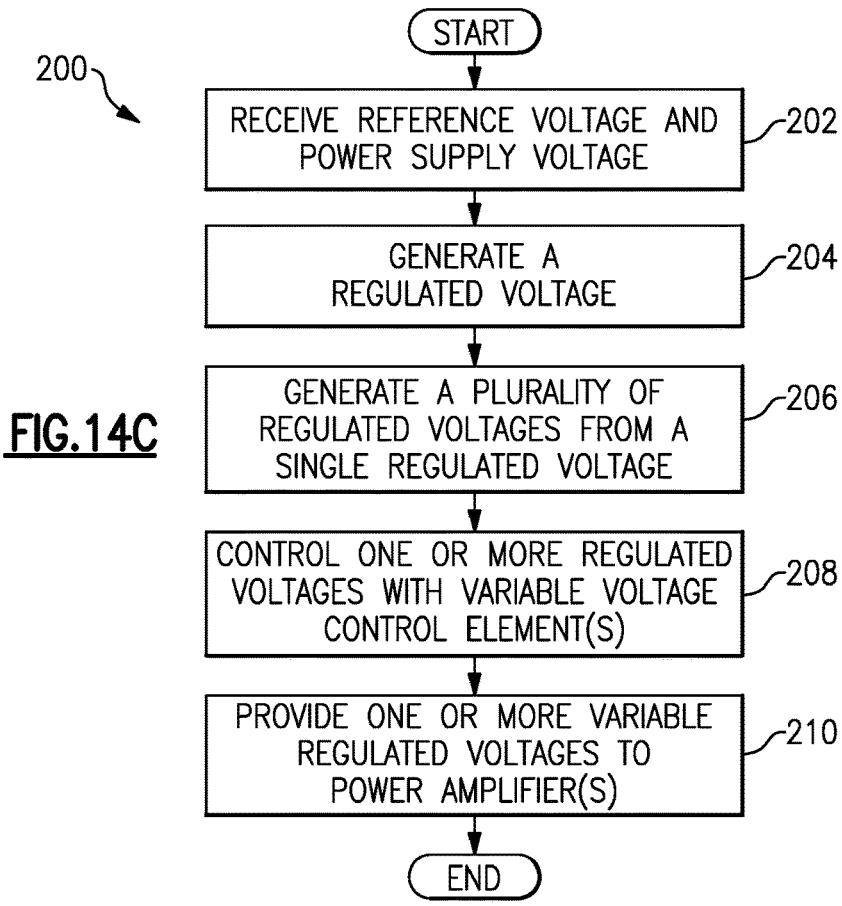
FIG. 14C shows a process of providing a plurality of variable regulated voltages from a single regulated voltage.

FIG. 14C shows a process 200 of providing a plurality of variable regulated voltages from a single regulated voltage. The process 200 can implement any combination of features described earlier in reference to the processes 180, 190. The process 200 can include: receiving a reference voltage and a battery voltage at block 202; generating a regulated voltage at block 204; generating a plurality of regulated voltages from a single regulated voltage at block 206; controlling one or more regulated voltages with a variable voltage control element(s) at block 208; and providing one or more variable regulated voltages to power amplifier(s) at block 210.

FIG. 15 illustrates an electronic system 220 that includes a variable voltage distribution function according to one embodiment. The electronic system 220 illustrates how bias control circuits can selectively provide PAs with variable regulated voltages from a single LDO according to one embodiment. The electronic system 220 can implement low band and/or high band functionality, in addition to operating in three different power modes (low power, medium power, and high power).

The voltage regulator 222 can receive a reference voltage Vref_in, a power supply voltage Vbatt, and a feedback signal Vfb from a variable voltage distribution circuit 204. From the received signals, the voltage regulator 222 can provide the variable voltage distribution circuit 204 with a regulated voltage Vreg. The control 206 can selectively control the regulated voltages that the variable voltage distribution circuit 204 can provide to bias inputs of one or more PA stages 208a, 208b, 212a, 212b, 216a, 216b, 220a, 220b. With the control 206 and the variable voltage distribution circuit 204, the electronic system can provide high band and/or low band signals and operate at a low, medium, or high power mode.

Table 2 provides one example implementation of multiple power modes and operation for multiple frequency bands. When PA stages are not provided with regulated voltages, their respective input nodes can discharge. Current mirrors, or similar circuit elements, can then bring the current inside the PA close to zero as the input discharges.

TABLE 2

| Band, Mode | PA Stages Receiving a Variable Regulated Voltage (FIG. 15) | Voltage Level |
|---|---|---|
| High Band, High Power | 208a, 208b | High |
| High Band, Medium Power | 212a, 212b | Medium |
| High Band, Low Power | 212a | Low |
| Low Band, High Power | 216a, 216b | High |
| Low Band, Medium Power | 220a, 220b | Medium |
| Low Band, Low Power | 220a | Low |

As shown in Table 2, only PA stages 208a, 208b, 212a, 212b for the high band data path can be provided with regulated voltages in high band mode. Similarly, only PA stages 216a, 216b, 220a, 220b for the low band data path can be provided with regulated voltages in low band mode. In one embodiment, the variable voltage distribution 204 can be implemented on an integrated circuit with pins for VregH_High, VregH_Med, VregH_Low on a first side and pins for VregL_High, VregL_Med, VregL_Low on an opposing side. This can provide for shorter routing, reduced area, and reduced power consumption. For example, the high band data path can be placed near the first side and the low band data path can be place near the opposing side.

As also shown in Table 2, certain power amplifiers within each data path can receive regulated voltages depending on the power mode. For example, in high band, high power operation, a regulated voltage VregH_High with a High voltage level can be provided to a bias input in PA stages 208a, 208b. In addition, certain PA stages can be provided with regulated voltages during more than one power mode of operation. These PA stages can receive different voltage levels based on the power mode. For example, PA stages 212a, 220a can receive a regulated voltage VregH_Low, VregL_Low, respectively, in both medium power mode and low power mode when their respective bands are enabled. Variable voltage elements in the variable voltage distribution circuit 204 can adjust the regulated voltage Vreg provided by the voltage regulator 222 to a Medium level for medium power mode and a Low level for low power mode. This can allow the PA stages 212a, 220a to be used in both low and medium power modes, saving additional area and power. In low power mode, only one PA stage 212a, 220a can be used. When the state of a switch 224, 226 is changed, then the one PA stage 212a, 220a can be coupled to a second PA stage 212b, 220b for operation in medium power mode using both stages.

Voltage levels provided to PA stages can change based on the power mode. For example, a different voltage level can be implemented for each power mode. The particular voltage levels can be based on industry specifications and/or standards, for example. One or more of the high, medium and/or low voltage levels can be different between the low band data path and the high band data path. Alternatively or additionally, one or more of the high, medium and/or low voltage levels can be the same in the low band data path and the high band data path.

Applications

Some of the embodiments described above have provided examples in connection with wireless devices and/or mobile phones. However, the principles and advantages of the embodiments can be used for any other systems or apparatus that have needs for distribution and/or variation of regulated voltage(s).

Such voltage regulation systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An electronic system with variable voltage distribution, the electronic system comprising:
    a voltage regulator configured to generate a regulated voltage; and
    a variable voltage distribution circuit in communication with the voltage regulator, the variable voltage distribution circuit including a first variable voltage control element that is outside of a feedback loop configured to provide a feedback signal to an input of the voltage regulator in a first mode, a second variable voltage control element, and distribution elements configured to selectively pass the regulated voltage to the first variable voltage control element such that the first variable voltage control element receives the regulated voltage in the first mode, and to selectively pass the regulated voltage to the second variable voltage control element such that the second variable voltage control element receives the regulated voltage in a second mode.

2. The electronic system of claim 1 wherein a distribution element of the distribution elements is included in the feedback loop.

3. The electronic system of claim 2 wherein the voltage regulator is configured to generate the regulated voltage based on a comparison of the feedback signal with a reference voltage.

4. The electronic system of claim 1 wherein the voltage regulator includes a low dropout regulator.

5. The electronic system of claim 1 wherein the first mode is a first power mode and the second mode is a second power mode.

6. The electronic system of claim 1 wherein the first variable voltage control element includes a field effect transistor.

7. The electronic system of claim 1 further comprising a power amplifier including a first stage and a second stage, the first stage being electrically connected to the first variable voltage control element, and the second stage being electrically connected to the second variable voltage control element.

8. The electronic system of claim 1 wherein the variable voltage distribution circuit includes a third variable voltage control element, and the distribution elements are configured to selectively pass the regulated voltage to the third variable voltage control element such that the third variable voltage control element receives the regulated voltage in a third mode.

9. The electronic system of claim 1 wherein the voltage regulator is a low dropout regulator that includes an error amplifier and a pass transistor electrically connected to an output of the error amplifier, and the pass transistor is configured to provide a regulated voltage.

10. A power amplifier system comprising:
    power amplifier stages including a first power amplifier stage and a second power amplifier stage;
    a low dropout regulator including an error amplifier and a pass transistor electrically connected to an output of the error amplifier, the pass transistor configured to provide a regulated voltage; and
    a variable voltage distribution circuit configured to receive the regulated voltage from the pass transistor; to provide a first variable regulated voltage to the first power amplifier stage in a first mode, the first variable regulated voltage being generated by selectively varying the regulated voltage; and to provide a second variable regulated voltage to the second power amplifier stage in a second mode, the second variable regulated voltage being generated by selectively varying the regulated voltage.

11. The power amplifier system of claim 10 wherein the variable voltage distribution circuit includes a variable voltage control element configured to vary the regulated voltage in the first mode, and the variable voltage control element is outside of a feedback loop configured to provide a feedback signal to an input of the low dropout regulator in the first mode.

12. The power amplifier system of claim 10 wherein the variable voltage distribution circuit is on a first die and the power amplifier stages are on a second die.

13. The power amplifier system of claim 10 wherein the variable voltage distribution circuit includes a first variable voltage control element configured to generate the first variable regulated voltage by varying the regulated voltage responsive to a control signal and a first distribution element configured to selectively pass the regulated voltage to the first variable voltage control element such that the first variable voltage control element receives the regulated voltage in the first mode.

14. The power amplifier system of claim 13 wherein the first distribution element is configured to close a feedback loop from an output of the low dropout regulator to an input of the low dropout regulator in the first mode.

15. The power amplifier system of claim 10 wherein the power amplifier system is configured to couple an output of the first power amplifier stage to an input of the second power amplifier stage in the second mode via a switch.

16. The power amplifier system of claim 10 wherein the first power amplifier stage and the second power amplifier stage are each configured to receive the same input signal.

17. A circuit with variable voltage distribution, the circuit comprising:
a low dropout regulator including an error amplifier and a pass transistor electrically connected to an output of the error amplifier, the low dropout regulator configured to output a regulated voltage; and
a variable voltage distribution circuit configured to receive the regulated voltage from the pass transistor, generate a first voltage by selectively varying the regulated voltage responsive to a first control signal, provide the first voltage to a first load in a first mode, generate a second voltage by selectively varying the regulated voltage responsive to a second control signal, and provide the second voltage to a second load in a second mode.

18. The circuit of claim 17 wherein the variable voltage distribution circuit includes a first variable voltage control element configured to generate the first voltage and a first distribution element configured to selectively pass the regulated voltage to the first variable voltage control element such that the first variable voltage control element receives the regulated voltage in the first mode.

19. The circuit of claim 18 wherein the first distribution element is configured to close a feedback loop in the first mode, the feedback loop being configured to generate a feedback signal provided to the low dropout regulator.

20. The electronic system of claim 1 wherein the voltage regulator is a low dropout regulator that includes an error amplifier and a pass transistor electrically connected to an output of the error amplifier, and the pass transistor is configured to provide the regulated voltage.

* * * * *

UNITED STATES PATENT AND TRADEMARK OFFICE
CERTIFICATE OF CORRECTION

PATENT NO. : 10,236,847 B2
APPLICATION NO. : 15/498039
DATED : March 19, 2019
INVENTOR(S) : Karl J. Couglar et al.

Page 1 of 1

It is certified that error appears in the above-identified patent and that said Letters Patent is hereby corrected as shown below:

In the Specification

In Column 24, Line 49, change "1106," to --110B,--.

In the Claims

In Column 32, Line 24-28, in Claim 20, change "The electronic system of claim 1 wherein the voltage regulator is a low dropout regulator that includes an error amplifier and a pass transistor electrically connected to an output of the error amplifier, and the pass transistor is configured to provide the regulated voltage." to --The circuit of claim 17 wherein the first load is a first stage of a power amplifier and the second load is a second stage of the power amplifier.--.

Signed and Sealed this
Thirtieth Day of June, 2020

Andrei Iancu
*Director of the United States Patent and Trademark Office*